United States Patent
Watanabe et al.

(10) Patent No.: US 7,888,937 B2
(45) Date of Patent: Feb. 15, 2011

(54) BEAM CURRENT SENSOR

(75) Inventors: Tamaki Watanabe, Saitama (JP); Takeshi Katayama, Tokyo (JP); Masayuki Kase, Saitama (JP); Tokihiro Ikeda, Saitama (JP); Shin-ichi Watanabe, Tokyo (JP); Takeo Kawaguchi, Akashi (JP); Yu-ichiro Sasaki, Machida (JP); Bunji Mizuno, Ikoma (JP); Hisataka Kanada, Katano (JP)

(73) Assignees: Riken, Wako-shi, Saitama (JP); Panasonic Corporation, Kadoma-shi, Osaka (JP)

( * ) Notice: Subject to any disclaimer, the term of this patent is extended or adjusted under 35 U.S.C. 154(b) by 915 days.

(21) Appl. No.: 10/573,270

(22) PCT Filed: Sep. 22, 2004

(86) PCT No.: PCT/JP2004/013804
§ 371 (c)(1),
(2), (4) Date: May 3, 2007

(87) PCT Pub. No.: WO2005/029100
PCT Pub. Date: Mar. 31, 2005

(65) Prior Publication Data
US 2007/0229057 A1   Oct. 4, 2007

(30) Foreign Application Priority Data
Sep. 24, 2003   (JP) .............................. 2003-331848

(51) Int. Cl.
*G01R 33/44* (2006.01)

(52) U.S. Cl. ..................... 324/318; 324/654; 324/76.11; 324/117 R

(58) Field of Classification Search ............. 324/117 R, 324/151 A, 318, 76.11
See application file for complete search history.

(56) References Cited

U.S. PATENT DOCUMENTS 4,687,987 A  *  8/1987  Kuchnir et al. ............. 324/71.3
5,270,675 A  *  12/1993  Mori et al. .................. 335/128

FOREIGN PATENT DOCUMENTS

| JP | 63-070089 U | 5/1988 |
| JP | 7-135099 A  | 5/1995 |

OTHER PUBLICATIONS

Kuchnir, M. et al. SQUID Based Beam Current Meter. IEEE Trans. Mag. vol. 21, No. 2, 1985, pp. 997 to 999.

* cited by examiner

*Primary Examiner*—Vincent Q Nguyen
(74) *Attorney, Agent, or Firm*—Birch, Stewart, Kolasch & Birch, LLP

(57) ABSTRACT

A beam current sensor is composed of a cylindrical superconductive body having a bridge unit formed on the outer diameter side wherein a beam passes through the inner diameter side. The sensor improves efficiency of creating a magnetic field from a current and can measure a beam current as 1 nA. The bridge unit includes a first coil unit formed so as to have an eddy shape wound counterclockwise from the outer diameter side toward the inner diameter side; a second coil unit formed so as to have an eddy shape wound clockwise from the outer diameter side toward the inner diameter side; and a connection portion for connecting the center position of the inner diameter side of the first coil unit with the center position of the inner diameter side of the second coil.

1 Claim, 29 Drawing Sheets

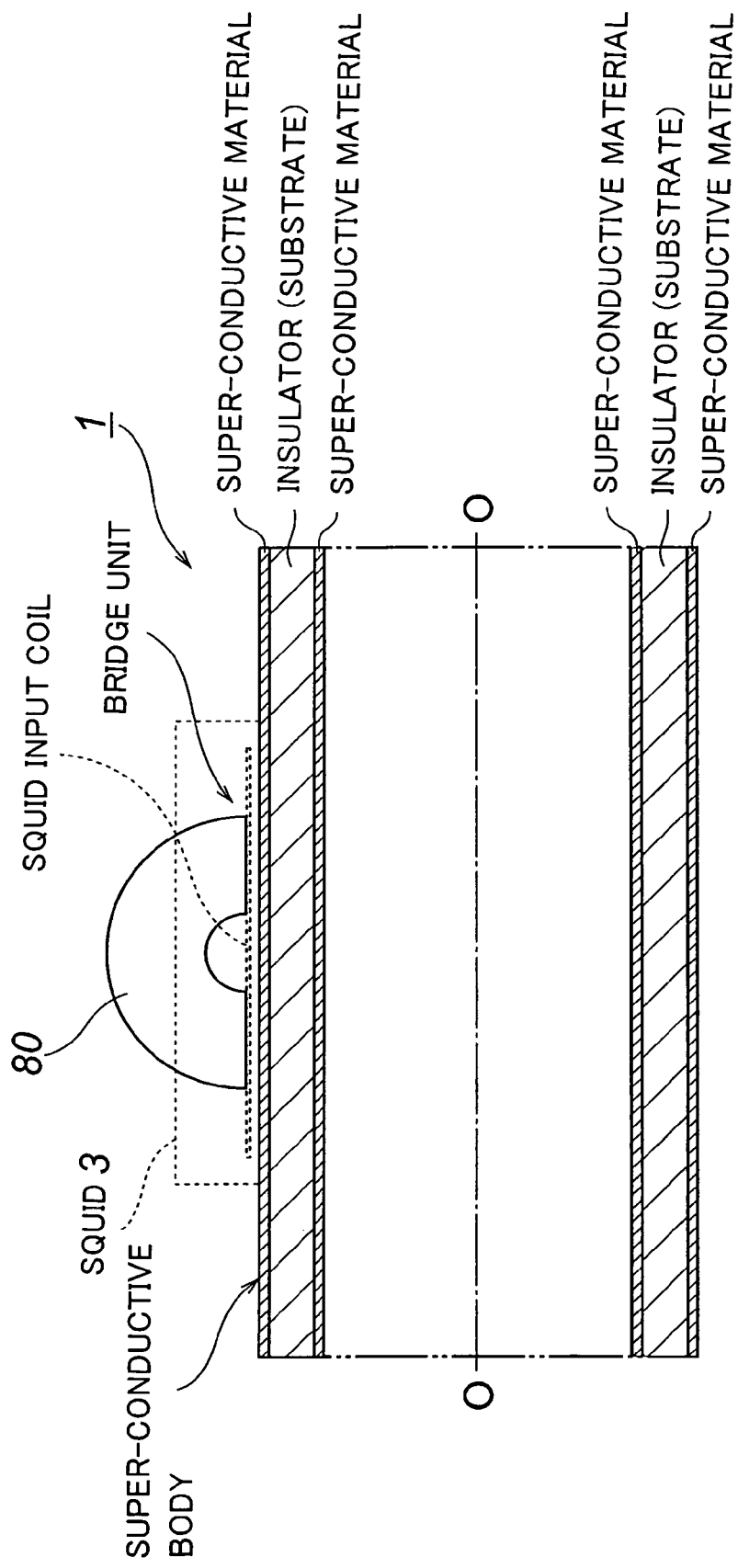

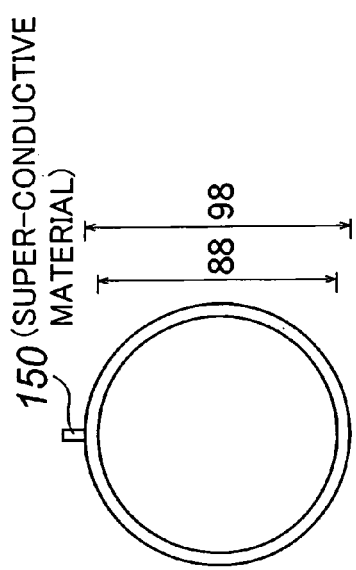
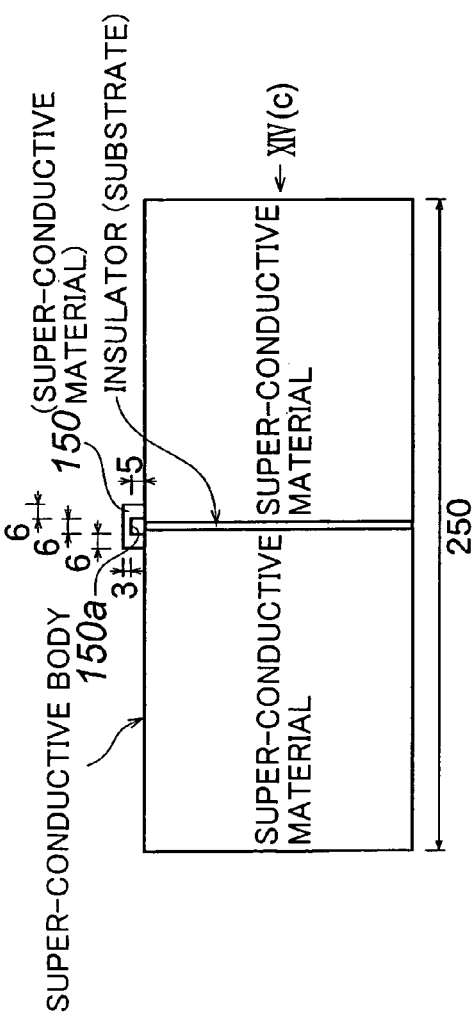
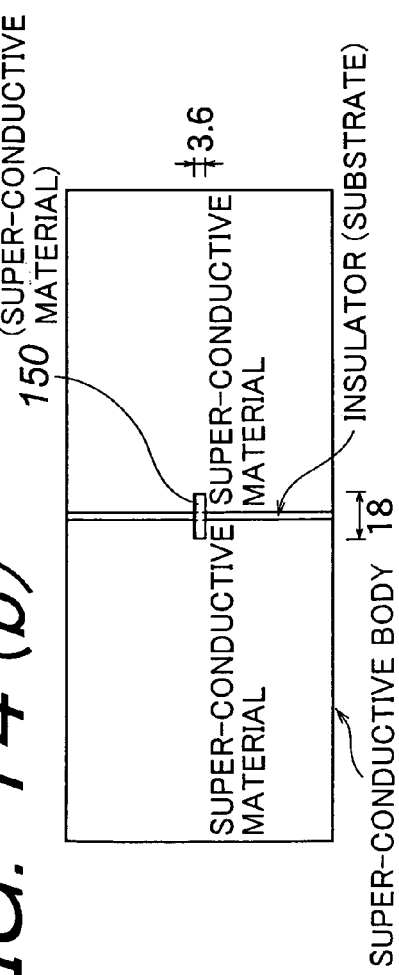
(UNIT:mm)

(UNIT:mm)

FIG. 21
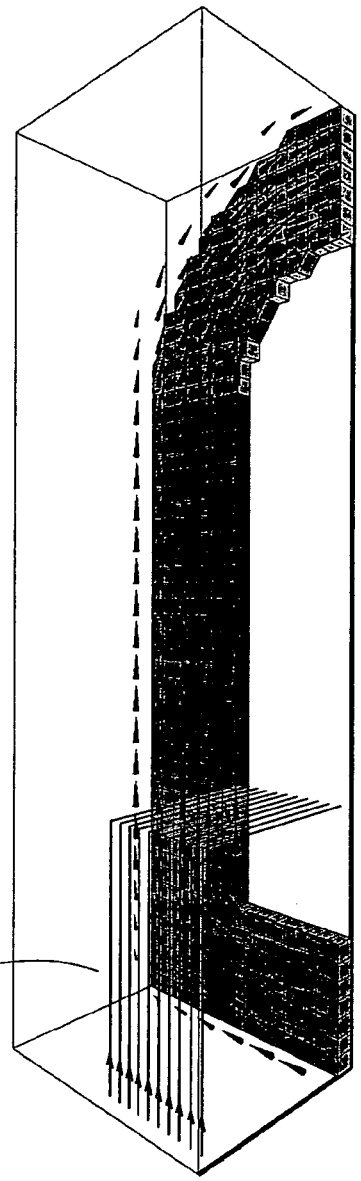
CURRENT FLOWING IN BRIDGE UNIT 150 IS 1mA IN TOTAL.
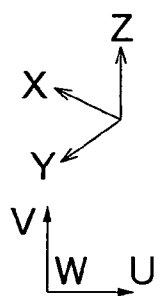

BEAM CURRENT SENSOR

TECHNICAL FIELD

The present invention relates to a beam current sensor, more specifically to a beam current sensor that is preferably used when a beam current meter, which measures a faint beam current non-destructively and highly accurately, is constituted in combination with a SQUID.

BACKGROUND TECHNOLOGY

Conventionally, a DCCT (DC Current Transformer) of a magnetic modulation type, for example, is known as a beam current meter.

However, in the conventional DCCT of a magnetic modulation type, the lower limit for measuring and electric current is in an order of several $\mu A$ and there has been a problem that the meter could not measure a faint beam current of about several nA.

To solve such a problem, as a beam current meter capable of measuring the faint beam current of about several nA, a beam current meter using a SQUID (Superconducting Quantum Interference Device), which is used for measuring a magnetic field generated by a brain or a heart, and a magnetic shield that consists of a super-conductive body operating at a liquid helium temperature, has been developed by GSI (Gesellschaft fur Schwerionenforschung) of Germany, old Institute for Nuclear Study of Tokyo University, or Research Center for Nuclear Physics of Osaka University (refer to Non-patent document 1, Non-patent document 2, Non-patent document 3, Non-patent document 4 and Non-patent document 5 to be described later).

It is to be noted that the beam current meter capable of measuring a faint beam current of about several nA has as 1000 times higher sensitivity than that of a conventional beam current meter for measuring a beam current of an order of several $\mu A$. In a comparison of specific magnetic fields, since earth magnetism is $10^{-5}$ T, a cerebric magnetic field is $10^{-15}$ T, and a point 20 cm apart from the center of a magnetic field created by a beam of 1 nA is $10^{-15}$ T, the beam current meter capable of measuring a faint beam current of about several nA must measure a very faint magnetic field.

Herein, FIG. 1 and FIG. 2 show structural schematic constitutions of a conventional beam current meter using the above-described SQUID and the magnetic shield that consists of the super-conductive body operating at a liquid helium temperature. Specifically, FIG. 1 and FIG. 2 show only mechanical and structural constitutions contributing to the understanding of the present invention, and illustration of various electrical connecting states, electrical conductive states and means for detecting temperature or the like are omitted. It is to be noted that FIG. 1 is a sectional view taken along A-A line of FIG. 2, and FIG. 2 is a sectional view taken along B-B line of FIG. 1.

Further, in the description of this specification and the accompanying drawings, the same or corresponding constitutions and contents are shown by using the same reference characters, duplicate explanation for the constitutions and functions will be omitted.

In FIG. 1 and FIG. 2, reference character 1 designates a beam current sensor composed of a super-conductive body, reference character 2 designates a magnetic shield composed of the super-conductive body, reference character 3 designates a SQUID, reference character 4 designates a cooling medium tank, reference character 5 designates a vacuum vessel, reference character 6 designates an upper flange, reference character 7 designates a beam duct, reference character 8 designates a trestle, reference character 9 designates liquid helium being the cooling medium, reference character 10 designates a vacuum area in the vacuum vessel 5, and reference character 11 designates an atmospheric air area outside the vacuum vessel 5.

More specifically, the vacuum vessel 5 is constituted in such a manner that a side of the upper surface 5a is closed by the upper flange 6, the through holes 5c that constitute the beam ducts 7 are severally formed on facing positions on a circumferential wall surface, and a side of the bottom surface 5b is supported on the trestle 8.

In the beam current meter, a beam is made incident from one of the through holes 5c, which constitutes one of the beam ducts 7, and is output from the other through hole 5c that constitutes the other beam duct 7.

Then, the cylindrical beam current sensor 1 is installed in the vacuum vessel 5 such that the beam that is made incident into the vacuum vessel 5 passes through its inner diameter, and the SQUID 3 is installed on the upper surface side of the beam current sensor 1. Further, the cylindrical magnetic shield 2 composed of a super-conductive body is installed surrounding the outer diameter side of the beam current sensor 1 so as to allow the SQUID 3 to position between the shield and the beam current sensor 1.

The above-described beam current sensor 1, the SQUID 3 and the magnetic shield 2 are arranged in the doughnut-shaped cooling medium tank 4, and each of the above-described constituent members is arranged so as to allow the beam to pass a hollow region in the inner diameter side of the doughnut-shaped cooling medium tank 4.

It is to be noted that liquid helium being the cooling medium is filled in the cooling medium tank 4, and the beam current sensor 1, the SQUID 3 and the magnetic shield 2 arranged in the cooling medium tank 4 are cooled down to liquid helium temperature.

In the above-described constitution, the inside of the vacuum vessel 5 is maintained at $1 \times 10^{-4}$ Pa by a vacuum unit (not shown), and the beam is allowed to pass to the beam current meter. Specifically, the beam is allowed to pass so as to be made incident from one through hole 5c that constitutes one beam duct 7, and is output from the other through hole 5c that constitutes the other beam duct 7, and the beam current of the beam is measured.

Although the constitutions and functions of the beam current sensor 1 and the SQUID 3 and a measuring principle of the beam current meter using them are widely known technology, they will be briefly explained referring to FIG. 3 for the purpose of easier understanding of the present invention.

FIG. 3 shows the schematic constitution perspective conceptual exemplary view of the beam current sensor 1 where the SQUID 3 is attached to a bridge unit (described later) of the beam current sensor 1, and FIG. 4 shows a partially enlarged conceptual exemplary view of the schematic constitution of an area indicated by arrow A of FIG. 3.

The beam current sensor 1 is composed of a super-conductive body where a super-conductive material is formed on a substrate made of an insulator of a cylindrical shape. However, the super-conductive material is not formed circumferentially (in a headband state) on a surface of the outer diameter side at the central position in an axis direction of its circumferential wall surface, except for a linear part area being a bridge unit, and an insulator having a linear shape, that is, the substrate is exposed circumferentially (in a headband state) except for the linear bridge unit (refer to FIG. 4).

In short, in the beam current sensor 1, the linear insulator is formed circumferentially (in a headband state) on the surface of the outer diameter side of the circumferential wall of the cylindrical super-conductive body while only the bridge unit being the linear part region as it is. The above-described insulator is circumferentially arranged at the central position in the axis direction of the beam current sensor 1. Further, the SQUID 3 is arranged on the above-described bridge unit.

When the beam passes through a space of the inner diameter side of the beam current sensor 1, a shielding current flows on the surface of super-conductive body due to the Meissner effect. The shielding current flows only in the bridge unit, and a magnetic field in an azimuth angle is formed by the passage of the current.

Specifically, forming the bridge unit on the surface of the cylindrical super-conductive body makes it possible to efficiently concentrate the shielding current. By placing the SQUID 3 on the bridge unit, a magnetic field created by a current is measured and the measured magnetic field is converted into a current value, and the beam current can be measured non-destructively and highly accurately.

To measure the magnetic field formed in the azimuth angle direction on the bridge unit with good SN ratio, it is preferable to use a SQUID gradiometer as the SQUID 3.

The reason is that input coils for detecting a magnetic field are on the right and left of the SQUID gradiometer as shown in FIG. 4, in the case where an external noise magnetic flux is about to enter the right and left input coils, the external noise magnetic flux is completely cancelled if it has a common mode noise magnetic field of completely the same size and direction of the external noise magnetic flux and on the other hand, a magnetic field formed on the bridge unit the passage of a beam has a negative phase magnetic field of the same size as described above but opposite directions, and it can be detected with twice the sensitivity of a SQUID magnetometer being a one input coil type that is generally used.

By employing the SQUID gradiometer as the SQUID 3, the external noise magnetic field can be remarkably reduced, and it has become possible to remarkably improve the sensitivity limitation of a conventional DCCT of a magnetic modulation type by applying such technology of superconductivity.

Meanwhile, the conventional beam current sensor explained in above, it has been difficult to detect a magnetic field formed by a faint beam current of about 1 nA because a magnetic field formed in the air was detected by the SQUID to measure the beam current value, and has had a problem that it was difficult to measure a faint beam current value of about 1 nA.

Non-patent document 1: "A Cryodevice for induction monitoring of DC electron or ion beams with nano-ampere resolution", K. Grohamann, et al., Superconducting Quantum Interference Devices and Their Application, 1977, p. 311

Non-patent document 2: "SQUID based beam current meter", IEEE Trans. On Magnetics, Vol. MAG-21, No. 2, 1985, p. 997

Non-patent document 3: "A cryogenic current comparator for the absolute measurement of nA beams", AIP Conf. Proc. 451 (Beam Instrumentation Workshop), 1998, p. 163

Non-patent document 4: "Design and performance of an HTS current comparator for charged particle-beam measurements", L. Hao et al., IEEE Trans. On Appl. Supercond. (ASC2000), Vol. 11, No. 1, 2001-3, p. 635

Non-patent document 5: "High sensitivity measurement of beam current in storage rings", Tetsumi Tanabe, Kei Shinada, Bulletin of The Physical Society of Japan, Vol. 54, No. 1, 1999, p. 34

DISCLOSURE OF THE INVENTION

Problems to be Solved by the Invention

The present invention has been created in view of the above-described problems that the prior art has, and it is an object of the invention to provide a beam current sensor where a magnetic flux created from a current is efficiently transmitted to a magnetic field meter to make it possible to measure even a faint beam current value of about 1 nA.

Further, it is an object of the present invention to provide a beam current sensor where a magnetic field created from a current is efficiently transmitted to a SQUID to make it possible to measure even a faint beam current value of about 1 nA.

Means for Solving the Problems

To achieve the above-described objects, the present invention is that the bridge unit of the beam current sensor is constituted by forming into a coil shape (a helical shape), which is a spiral shape (a shape of plane curve that is wound helically) for example, to improve efficiency when forming a magnetic field from a current. It is preferable that the bridge unit be formed by a high-temperature super-conductive material.

Further, to achieve the above-described objects, the present invention is that a soft magnetic body, which is a high-permeability toroidal core or the like for example, is arranged in the bridge unit of the beam current sensor to make it possible to efficiently transmit the magnetic field, which is created from a current, to the SQUID via the soft magnetic body such as the high-permeability toroidal core.

Specifically, the present invention is a beam current sensor comprised a super-conductive body, which is a cylindrical body where a beam passes through an inner diameter side and a bridge unit is formed on an outer diameter side, in which the bridge unit is formed in a coil shape.

Further, the present invention is a beam current sensor comprised a super-conductive body, which is a cylindrical body where a beam passes through an inner diameter side and a bridge unit is formed on an outer diameter side, in which the bridge unit is constituted by including a first coil unit formed so as to have a spiral shape wound counterclockwise from the outer diameter side toward the inner diameter side; a second coil unit formed so as to have a spiral shape wound clockwise from the outer diameter side toward the inner diameter side; and a connection portion for connecting the center position of the inner diameter side of the first coil unit with the center position of the inner diameter side of the second coil unit.

Further, the present invention is a beam current sensor comprised a super-conductive body, which is a cylindrical body where a beam passes through an inner diameter side and a bridge unit to which a SQUID input coil is adjacently arranged is formed on an outer diameter side, in which the sensor has a soft magnetic body arranged near the bridge unit, and the SQUID input coil is arranged between the bridge unit and the soft magnetic body.

Furthermore, the present invention is a beam current sensor comprised a super-conductive body, which is a cylindrical body where a beam passes through an inner diameter side and a bridge unit to which a SQUID input coil is adjacently arranged is formed on an outer diameter side, in which the bridge unit is constituted by including a first coil unit formed so as to have a spiral shape wound counterclockwise from the outer diameter side toward the inner diameter side; a second coil unit formed so as to have a spiral shape wound clockwise from the outer diameter side toward the inner diameter side; and a connection portion for connecting the center position of the inner diameter side of the first coil unit with the center position of the inner diameter side of the second coil unit, the sensor includes a first soft magnetic body of an approximately rectangular parallelepiped shape arranged on the first coil unit; a second soft magnetic body of an approximately rectangular parallelepiped shape arranged on the second coil unit; and a third soft magnetic body including an approximately U-shape, where one end portion is arranged on the first soft magnetic body side and the other end portion is arranged on the second soft magnetic body side, and which bridges the first soft magnetic body and the second soft magnetic body, and the SQUID input coil is arranged between the first soft magnetic body and the one end portion of the third soft magnetic body and between the second soft magnetic body and the other end portion of the third soft magnetic body.

Further, the present invention is a beam current sensor comprised a super-conductive body, which is a cylindrical body where a beam passes through an inner diameter side and a bridge unit to which a SQUID input coil is adjacently arranged is formed on an outer diameter side, in which the sensor includes a soft magnetic body forming a magnetic closed loop surrounding the bridge unit, and the SQUID input coil is arranged between the bridge unit and the soft magnetic body.

Still further, the present invention is a beam current sensor comprised a super-conductive body, which is a cylindrical body where a beam passes through an inner diameter side and a bridge unit to which a SQUID input coil is adjacently arranged is formed on an outer diameter side, in which the bridge unit is bridged so as to pass over an insulator by forming a gap against the insulator and formed in a standing manner, includes a soft magnetic body that forms a magnetic closed loop by inserting a part thereof into the gap, and the SQUID input coil is arranged near the bridge unit and the soft magnetic body.

Effects of the Invention

Since the present invention is constituted as described above, it exerts an excellent effect that a beam current sensor where efficiency of forming a magnetic field from a current is improved can be provided.

Further, since the present invention is constituted as described above, it exerts an excellent effect that a beam current sensor capable of efficiently transmitting the magnetic field, which has been created from a current, to a SQUID.

BRIEF DESCRIPTION OF THE DRAWINGS

FIG. 7(b) shows an exemplary view of the schematic constitution of the bridge unit of the beam current sensor according to another example of the embodiments of the present invention, which is a partially enlarged conceptual exemplary view of the schematic constitution taken along VII-VII line corresponding to FIG. 5(b).

FIG. 14 shows a constitution of the bridge unit of the beam current sensor according to another example of the embodiments of the present invention, which is shown in FIG. 12 and FIG. 13, in which FIG. 14(a) is a front view, FIG. 14(b) is a view seen from arrow XIV(b), and FIG. 14(c) is a view seen from arrow XIV(c).

FIG. 16 shows the state where the high-permeability toroidal core and the SQUID are attached to the bridge unit, in which FIG. 16(a) is an enlarged constitution exemplary view of a principal portion of a state seen from a direction shown in FIG. 14(a), and FIG. 16(b) is an enlarged constitution exemplary view of a principal portion of a state seen from a direction shown in FIG. 14(c).

FIG. 20 shows the state where the SQUID is attached to the high-permeability toroidal core, in which

FIG. 21 shows a calculation result using the finite element method program (MAFIA) regarding the embodiment shown in FIG. 12 to FIG. 20, which shows an appearance of the magnetic flux of the high-permeability toroidal core.

EXPLANATION OF REFERENCE CHARACTERS

Figure 1:
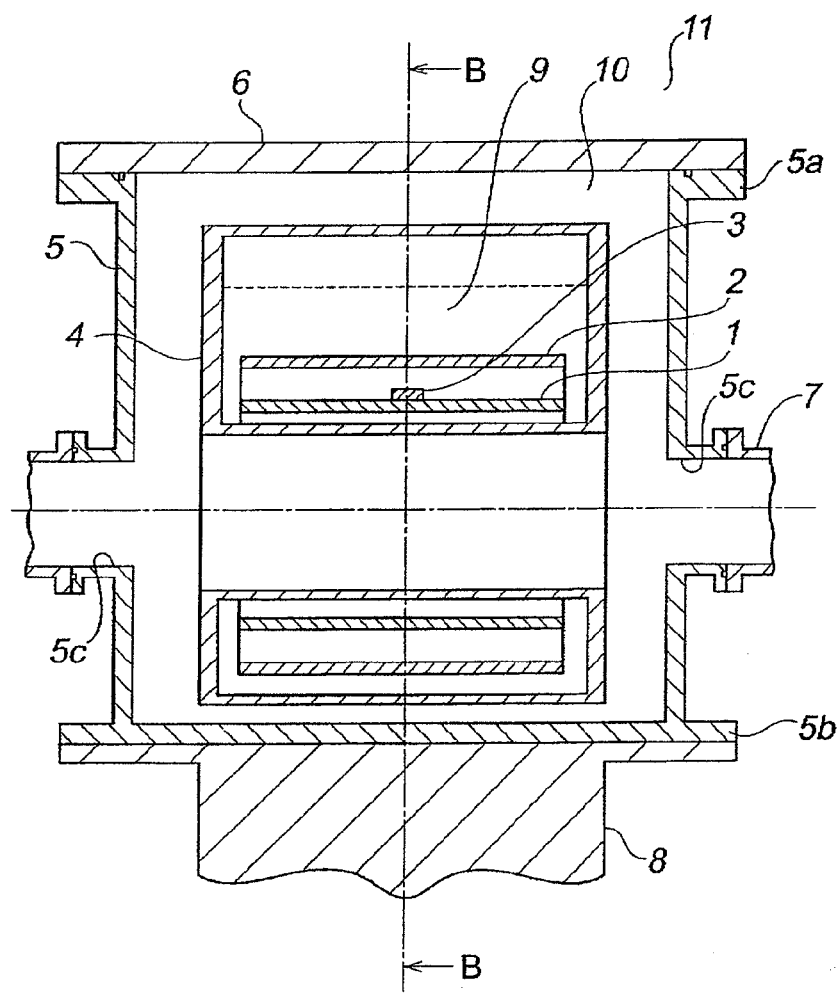
FIG. 1 is a sectional exemplary view of the schematic constitution of a conventional beam current meter using a SQUID and a magnetic shield composed of a super-conductive body operating at liquid helium temperature, which is a sectional view taken along A-A line of FIG. 2.
Figure 2:
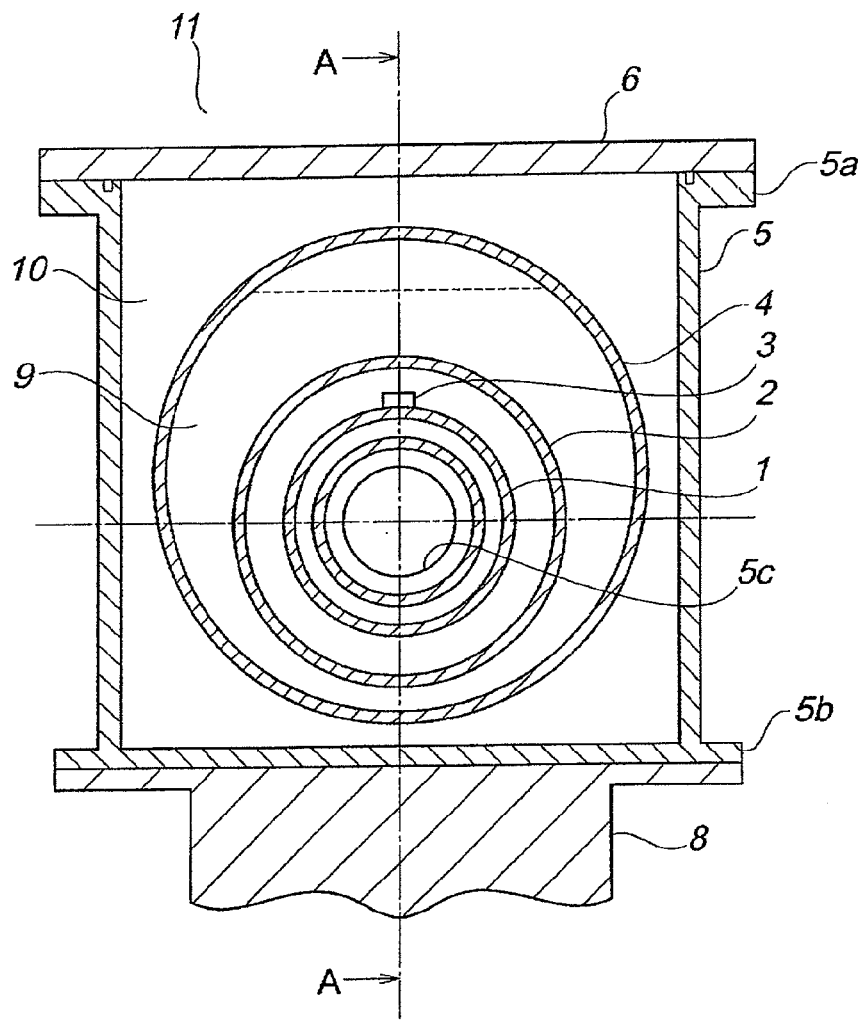
FIG. 2 is a sectional exemplary view of the schematic constitution of the conventional beam current meter using the SQUID and the magnetic shield that composed of a super-conductive body operating at liquid helium temperature, which is a sectional view taken along B-B line of FIG. 1.
Figure 3:
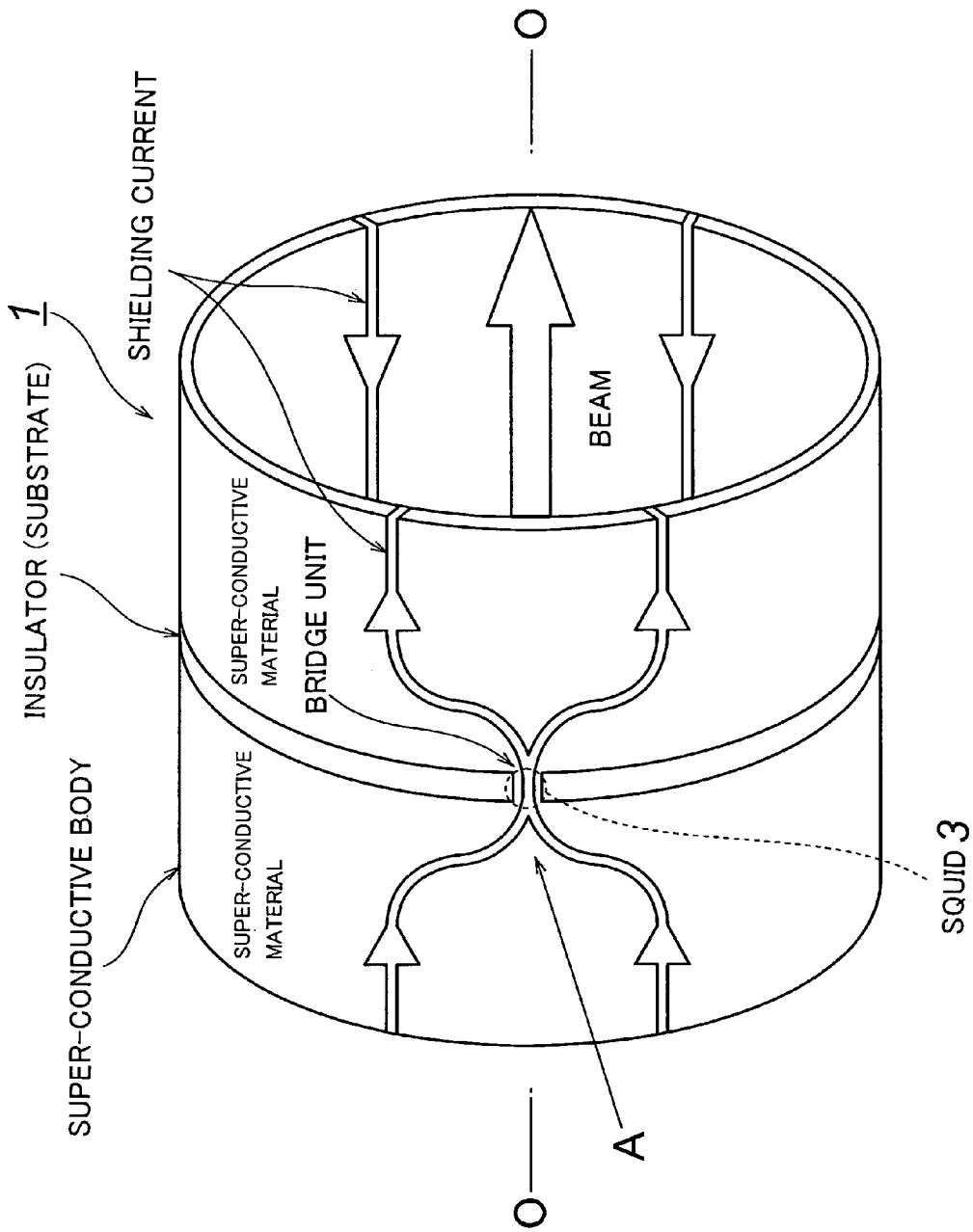
FIG. 3 is a perspective conceptual exemplary view of the schematic constitution of a beam current sensor where the SQUID is attached on the bridge unit of the beam current sensor.

1 Beam current sensor
2 Magnetic shield
3 SQUID
4 Cooling medium tank
5 Vacuum vessel
5a Upper surface
5b Lower surface
5c Through hole
6 Upper flange
7 Beam duct
8 Trestle
9 Liquid helium
10 Vacuum area
11 Atmospheric air area
50, 150 Bridge unit
52 First coil unit
54 Second coil unit
52a, 52b Center position
56 Connection portion
56a First position
56b Second position
56c Third position
80, 180 High-permeability toroidal core
82 First soft magnetic body
84 Second soft magnetic body
86 Third soft magnetic body

BEST MODE FOR IMPLEMENTING THE INVENTION

In the following, description will be made for an embodiment example of the beam current sensor according to the present invention with reference to the attached drawings.

Figure 4:
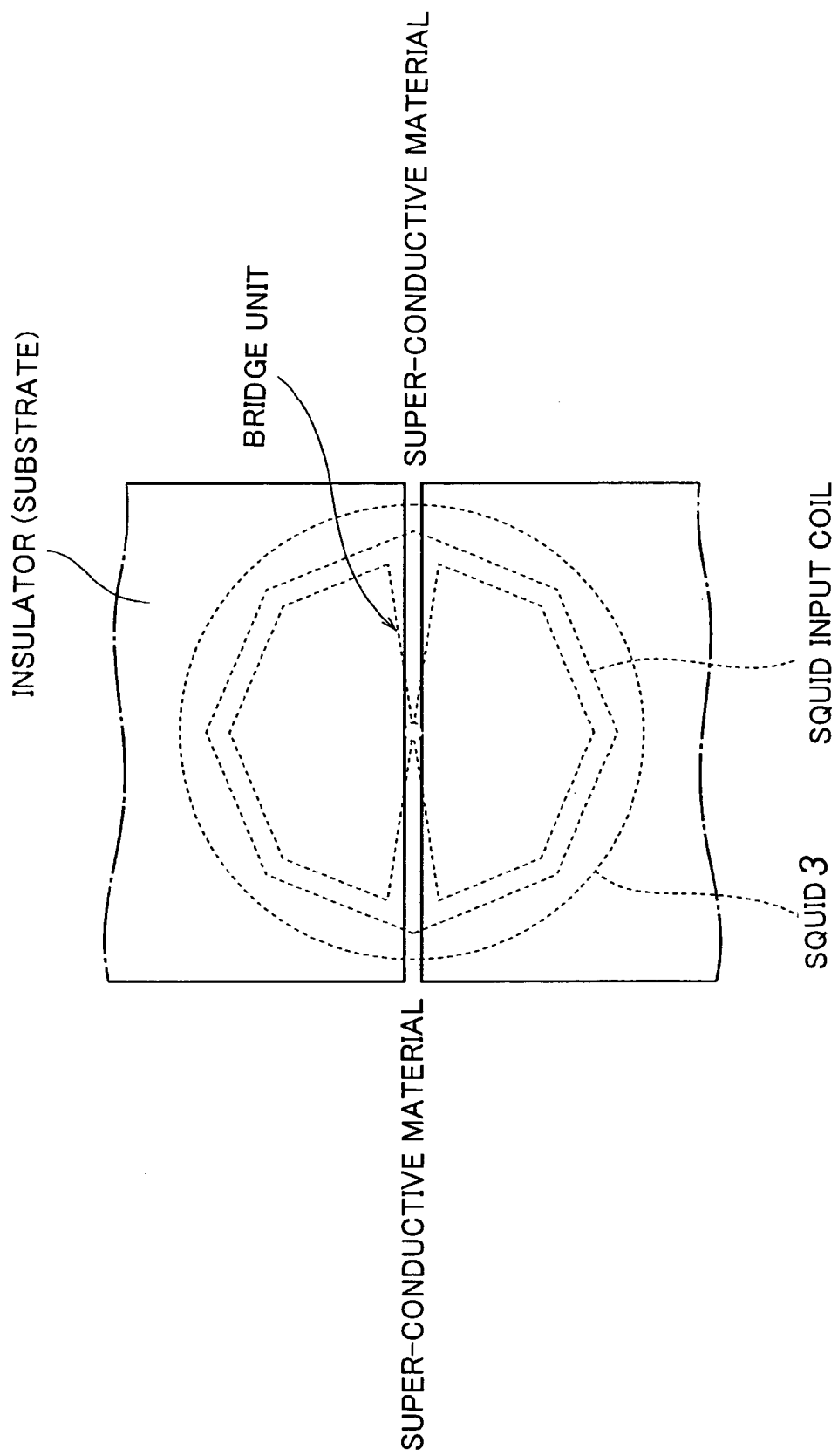
FIG. 4 is a partially enlarged conceptual exemplary view of the schematic constitution of an area indicated by arrow A of FIG. 3.
Figure 5:
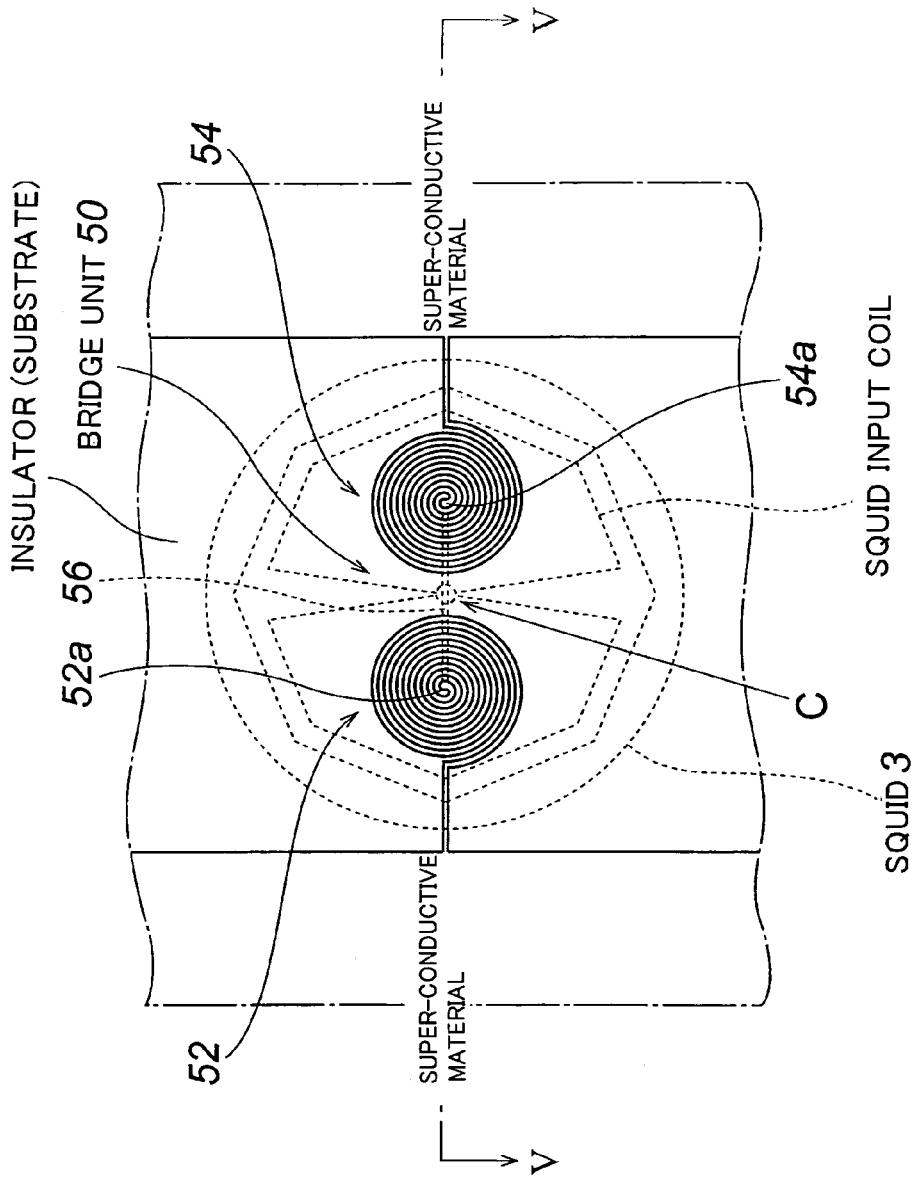
FIG. 5(a) shows an exemplary view of the schematic constitution of the bridge unit of a beam current sensor according to an embodiment example of the present invention, which is a partially enlarged conceptual exemplary view of the schematic constitution corresponding to FIG. 4.
FIG. 5(b) shows an exemplary view of the schematic constitution of the bridge unit of the beam current sensor according to an embodiment example of the present invention, which is a partially sectioned conceptual exemplary view of the schematic constitution taken along V-V line of FIG. 5(a).
Figure 5:
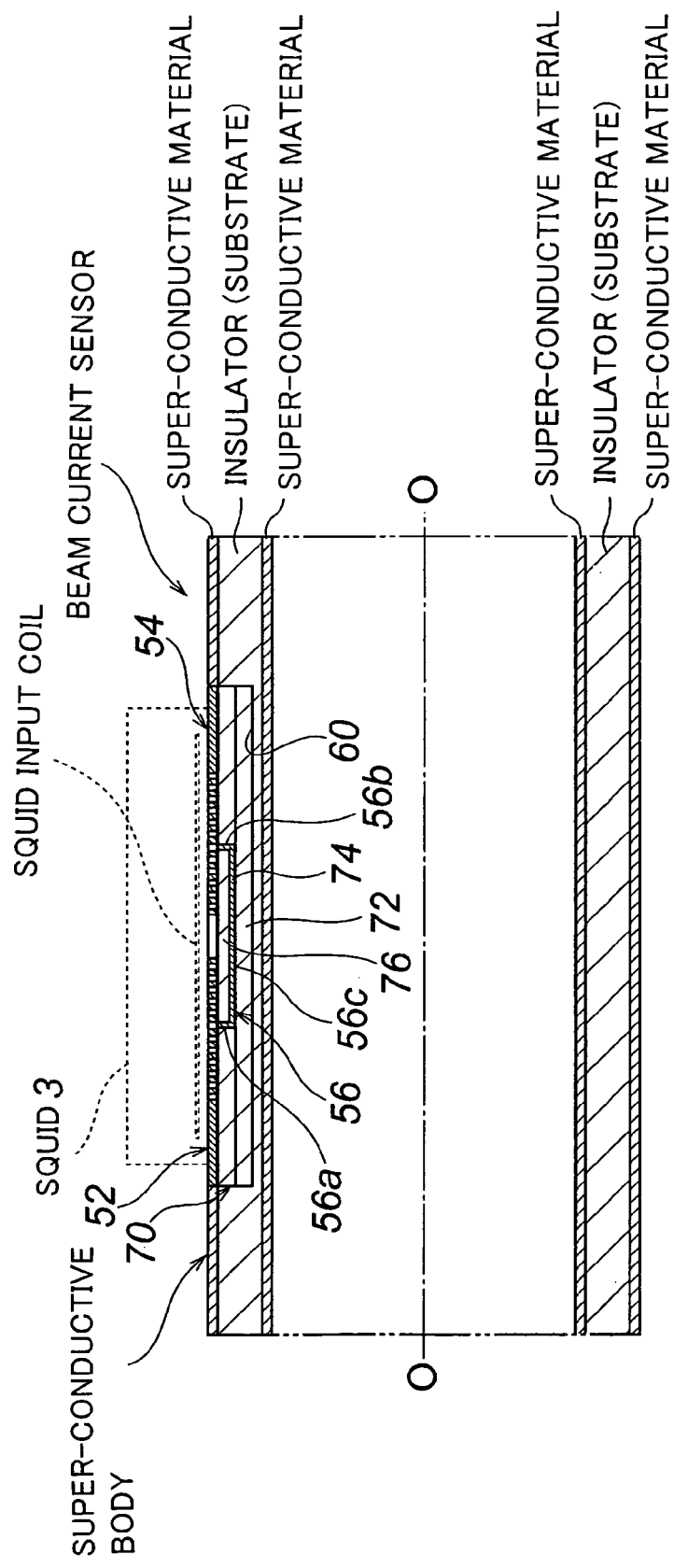

FIGS. 5(a)(b) show the exemplary views of the schematic constitution of the bridge unit of the beam current sensor according to an embodiment example of the present invention, in which FIG. 5(a) is the partially enlarged conceptual exemplary view of the schematic constitution corresponding to FIG. 4 and FIG. 5(b) is the partially sectioned conceptual exemplary view of the schematic constitution taken along V-V line of FIG. 5(a).

It is to be noted that the beam current sensor according to an embodiment example of the present invention is different from the above-described conventional beam current sensor 1 shown in FIG. 1 only in the constitution of the bridge unit, so that only the constitution of the bridge unit will be explained in the following description and the description of other parts will be omitted by citing the above-described description and FIG. 1.

The bridge unit 50 of the beam current sensor shown in FIGS. 5(a) (b) is constituted by a super-conductive material that is a high-temperature super-conductive material so as to form a spiral shape (a shape of plane curve that is wound helically), for example.

More specifically, the bridge unit 50 is constituted by including a first coil unit 52 formed so as to have a spiral shape traveling counterclockwise from the outer diameter side toward the inner diameter side on the left area of the center C of the SQUID input coil on FIG. 5(a); a second coil unit 54 formed so as to have a spiral shape traveling clockwise from the outer diameter side toward the inner diameter side on the right area of the center C of the SQUID input coil on FIG. 5(a); and a connection portion 56 for connecting the center position 52a of the inner diameter side of the first coil unit 52 of the spiral shape with the center position 54a of the inner diameter side of the second coil unit 54 of the spiral shape, and the first coil unit 52, the second coil unit 54 and the connection portion 56 are formed of the super-conductive material that is the high-temperature super-conductive material, for example.

It is to be noted that the connection portion 56 is disposed so as to connect only the center position 52 of the first coil unit 52 with the center position 54a of the second coil unit 54, and is disposed not to short circuit by contacting an area other than the center position 52 of the first coil unit 52 or an area other than the center position 54a of the second coil unit 54.

Specifically, as shown in FIG. 5(b), the connection portion 56 is constituted of a first position 56a extending from the center position 52a to the center axis O-O direction of the beam current sensor 1, a second position 56b extending from the center position 54a to the center axis O-O direction of the beam current sensor 1, and a third position 56c connecting the first position 56a with the second position 56b.

Herein, a manufacturing method of the above-described bridge unit 50 will be explained. First, a recessed portion 60 is formed on an area of the substrate, where the bridge unit 50 is arranged, and a substrate block 70 arranged in the recessed portion 60 is manufactured.

When manufacturing the substrate block 70, a super-conductive body 74 that becomes the third position 56c of the connection portion 56 is formed on the upper surface of a bottom side insulator 72, an upper side insulator 76 is further formed thereon, and the super-conductive body 74 that becomes the third position 56c is sandwiched by the bottom side insulator 72 and the upper side insulator 76.

Next, by sintering the upper side insulator 72 after coating the super-conductive material that is the high-temperature super-conductive material on the surface of the insulator, a super-conductive body is formed. After that, a mask showing the patterns of the shapes of the first coil unit 52 and the second coil unit 54 is arranged, the super-conductive body in unmasked areas is removed by etching of ion beam irradiation to expose the substrate, and the first coil unit 52 and the second coil unit 54 are formed.

Next, fine holes are formed in the center position 52a of the first coil unit 52 and the center position 54a of the second coil unit 54 such that the holes reach the super-conductive body 74 that becomes the third position 56c, the super-conductive material that is the high-temperature super-conductive material, for example, is filled in the holes and sintered to form the first position 56a and the second position 56b and to form the connection portion 56 where the first position 56a, the second position 56b and the third position 56c are connected. With this, the first coil unit 52 and the second coil unit 54 are connected without causing short circuit.

As described, areas of the first coil unit 52, the second coil unit 54 and the connection portion 56 are previously manufactured on the small substrate 70, the substrate 70 on which the first coil unit 52, the second coil unit 54 and the connection portion 56 have been formed is joined in the recessed portion 60 that has been formed on the substrate of the beam current sensor, the super-conductive material is coated and sintered again after the junction to complete the beam current sensor.

According to the beam current sensor including the bridge unit 50, the magnetic field is increased by the number of turns of the first coil unit 52 and the second coil unit 54, efficiency of forming magnetic field from a current can be improved, and the beam current sensor capable of measuring even a faint current value of about 1 nA can be realized.

It is to be noted that MgO, for example, can be used as a material of insulator (substrate), and a high-temperature super-conductive material of Bi system can be used as a super-conductive material.

Figure 6A:
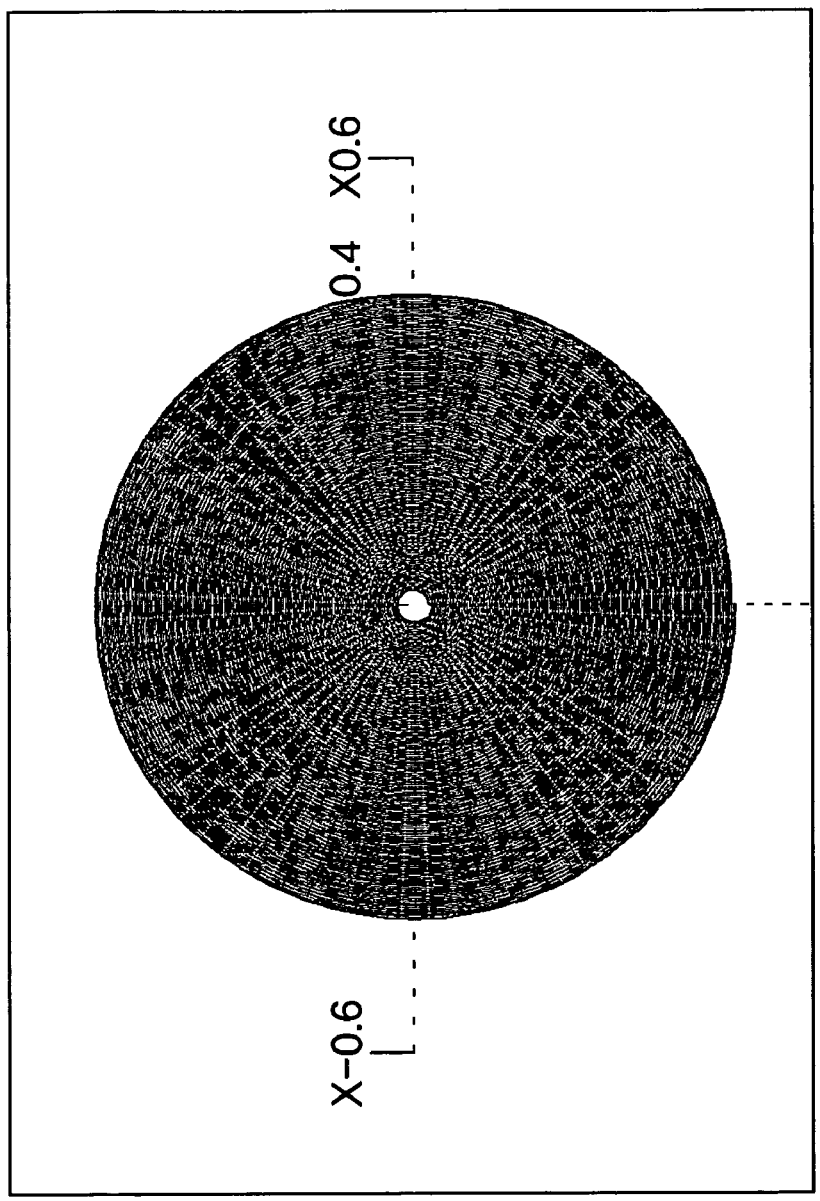
FIG. 6(a) is a simulation view of the first coil unit whose number of turns is 80, that is, 80 turns, and the first coil unit shown in the simulation view has a sectional shape of a square with a side of 30 micrometers and an outer diameter of 8 mm.
Figure 6:
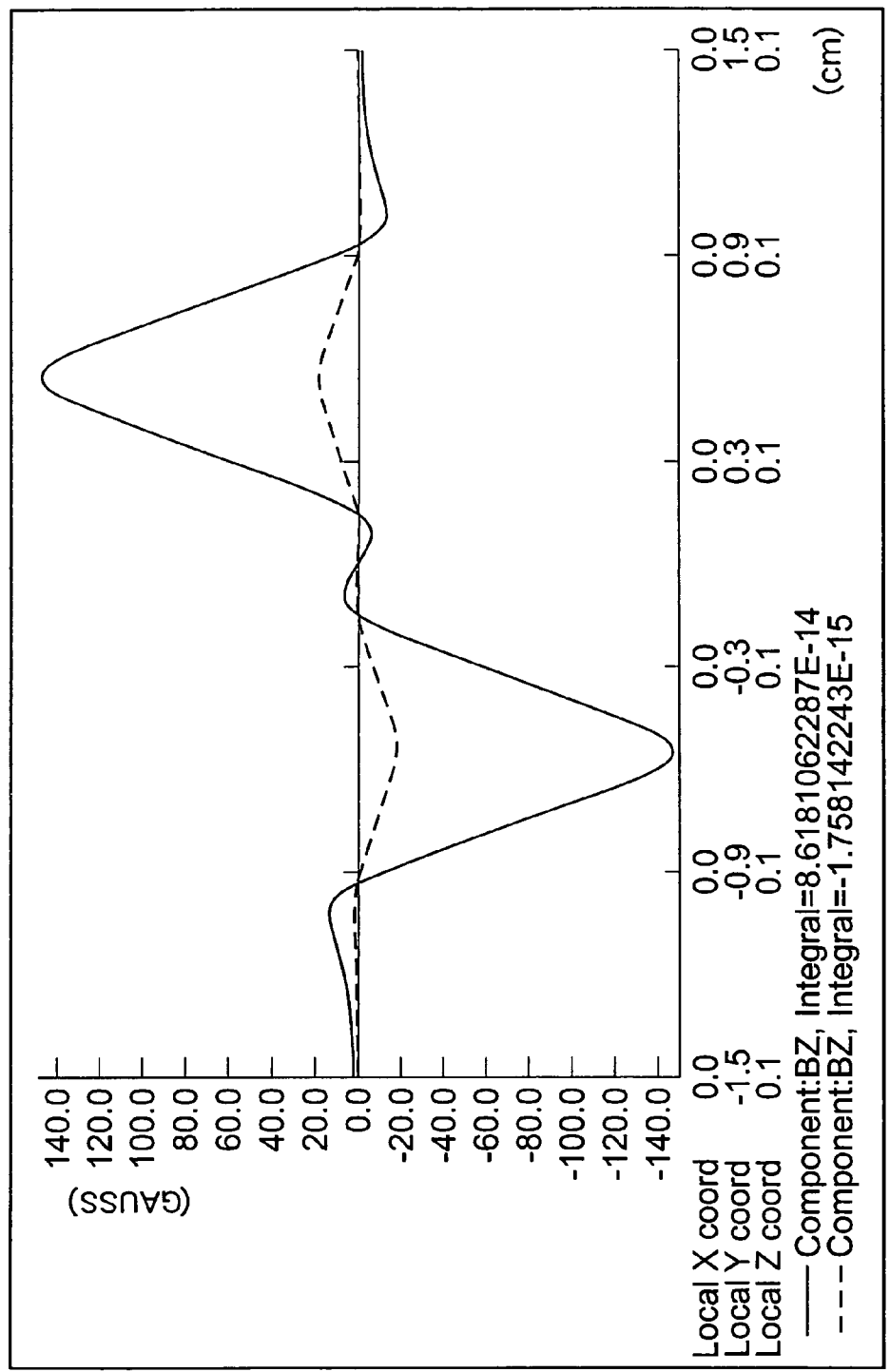
FIG. 6(b) shows a calculation result using a finite element method program (OPERA3D), that is, the first coil unit shown in FIG. 6(a) and the second coil unit, which has the number of turns of 80 turns, the sectional shape of the square with a side of 30 micrometers and an outer diameter of 8 mm in the same manner as the first coil unit, are supposed, and a calculation result of a magnetic field generated when the current of 1 A is allowed to conduct in the first coil unit and the second coil unit is shown.

Herein, FIG. 6(a) shows the simulation view of the first coil unit 52 whose number of turns is 80, that is, 80 turns. The first coil unit 52 shown in the simulation view has the sectional shape of a square with a side of 30 micrometers and the outer diameter of 8 mm.

Further, FIG. 6(b) shows the calculation result using the finite element method program (OPERA3D), that is, the first coil unit 52 shown in FIG. 6(a) and the second coil unit 54, which has the number of turns of 80 turns, the sectional shape of the square with a side of 30 micrometers and the outer diameter of 8 mm in the same manner as the first coil unit 52, are supposed, and the calculation result of a magnetic field generated when the current of 1 A is allowed to conduct in the first coil unit 52 and the second coil unit 54 is shown.

When the calculation result shown in FIG. 6(b) is compared with a magnetic field created by the conventional linear bridge unit shown in FIG. 4, a gain 31 times larger the conventional one was obtained by the first coil unit 52 and the second coil unit 54.

Figure 7A:
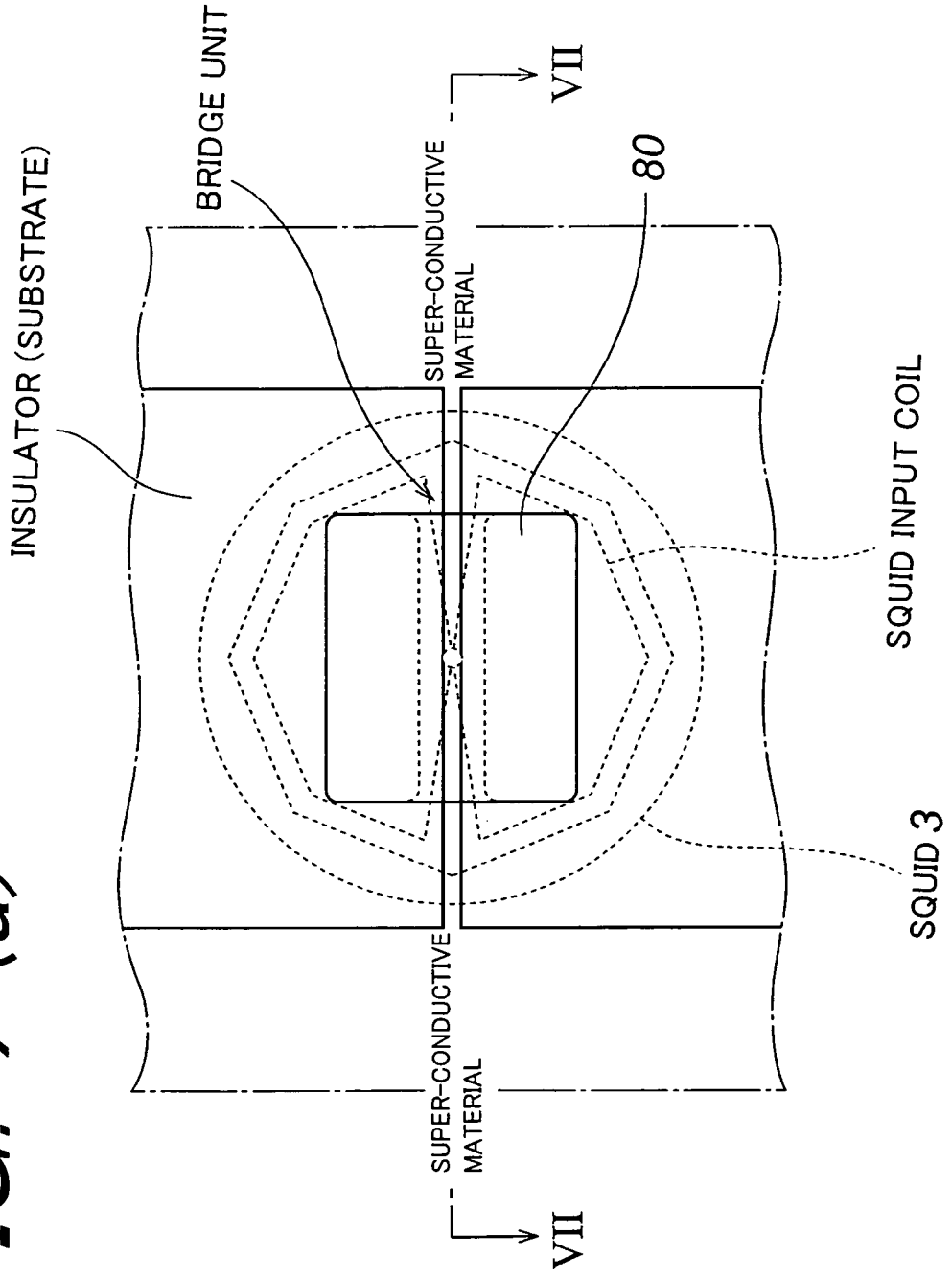
FIG. 7(a) shows an exemplary view of the schematic constitution of the bridge unit of the beam current sensor according to another example of the embodiments of the present invention, which is a partially enlarged conceptual exemplary view of the schematic constitution corresponding to FIG. 5(a).

Next, FIG. 7(a) (b) show the exemplary views of the schematic constitution of the bridge unit of the beam current sensor according to another example of the embodiments of the present invention. It is to be noted that FIG. 7(a) is the partially enlarged conceptual exemplary view of the schematic constitution corresponding to FIG. 5(a), and FIG. 7(b) is the partially enlarged conceptual exemplary view of the schematic constitution taken along VII-VII line corresponding to FIG. 5(b).

This embodiment is different from the conventional beam current sensor 1 on the point where a high-permeability toroidal core 80 of an approximately U-shape is arranged as a soft magnetic body on a SQUID input coil and the SQUID input coil is arranged between the bridge unit and the high-permeability toroidal core 80.

By arranging the high-permeability toroidal core 80 on the bridge unit in this manner, a magnetic flux concentrates on the high-permeability toroidal core 80, and it is possible to allow the SQUID input coil, which is arranged between the bridge unit and the high-permeability toroidal core 80, to efficiently capture the magnetic field created by a current.

Consequently, the magnetic field created from a current can be efficiently transmitted to the SQUID, and the beam current sensor capable of measuring even a faint current value of about 1 nA can be realized.

Next, FIGS. 8(a) (b) show the exemplary views of the schematic constitution of the bridge unit of the beam current sensor according to another example of the embodiments of the present invention.

The embodiment shown in FIGS. 8(a)(b) show an example of the constitution where a magnetic body such as the high-permeability toroidal core 80 is introduced in the embodiment shown in FIG. 5(a)(b).

It is to be noted that FIG. 8(a) is the perspective exemplary view of the schematic constitution of a principal portion, and FIG. 8(b) is the partially sectioned conceptual exemplary view of the schematic constitution corresponding to FIG. 5(b).

This embodiment has a first soft magnetic body 82 such as a high-permeability core of an approximately rectangular parallelepiped arranged on the first coil unit 52, more particularly a rectangular frustum shape whose upper portion is formed in a narrower diameter; a second soft magnetic body 84 such as a high-permeability core of an approximately rectangular parallelepiped arranged on the second coil unit 54, more particularly the rectangular frustum shape whose upper portion is formed in a narrower diameter; and a third soft magnetic body 86 such as a high-permeability core having an approximately U-shape, whose one end portion 86a is arranged on the first soft magnetic body 82 side and the other end portion 86b is arranged on the second soft magnetic body 84 side and which bridges the first soft magnetic body 82 and the second soft magnetic body 84.

Then, the SQUID input coil is arranged between the first soft magnetic body 82 and the one end portion 86a of the third soft magnetic body 86 and between the second soft magnetic body 84 and the other end portion 86b of the third soft magnetic body 86.

In such an embodiment, the magnetic flux of the magnetic field that has increased corresponding to the number of turns of the first coil unit 52 and the second coil unit 54 concentrates on the first soft magnetic body 82 and the second soft magnetic body 84, and further concentrates on the third soft magnetic body 86, so that it is possible to allow the SQUID input coil, which is arranged between the first soft magnetic body 82 and the one end portion 86a of the third soft magnetic body 86 and between the second soft magnetic body 84 and the other end portion 86b of the third soft magnetic body 86, to efficiently capture the magnetic field created by current.

Therefore, the magnetic field created from a current can be efficiently transmitted to the SQUID, and the beam current sensor capable of measuring even a faint current value of about 1 nA can be realized.

Figure 8:
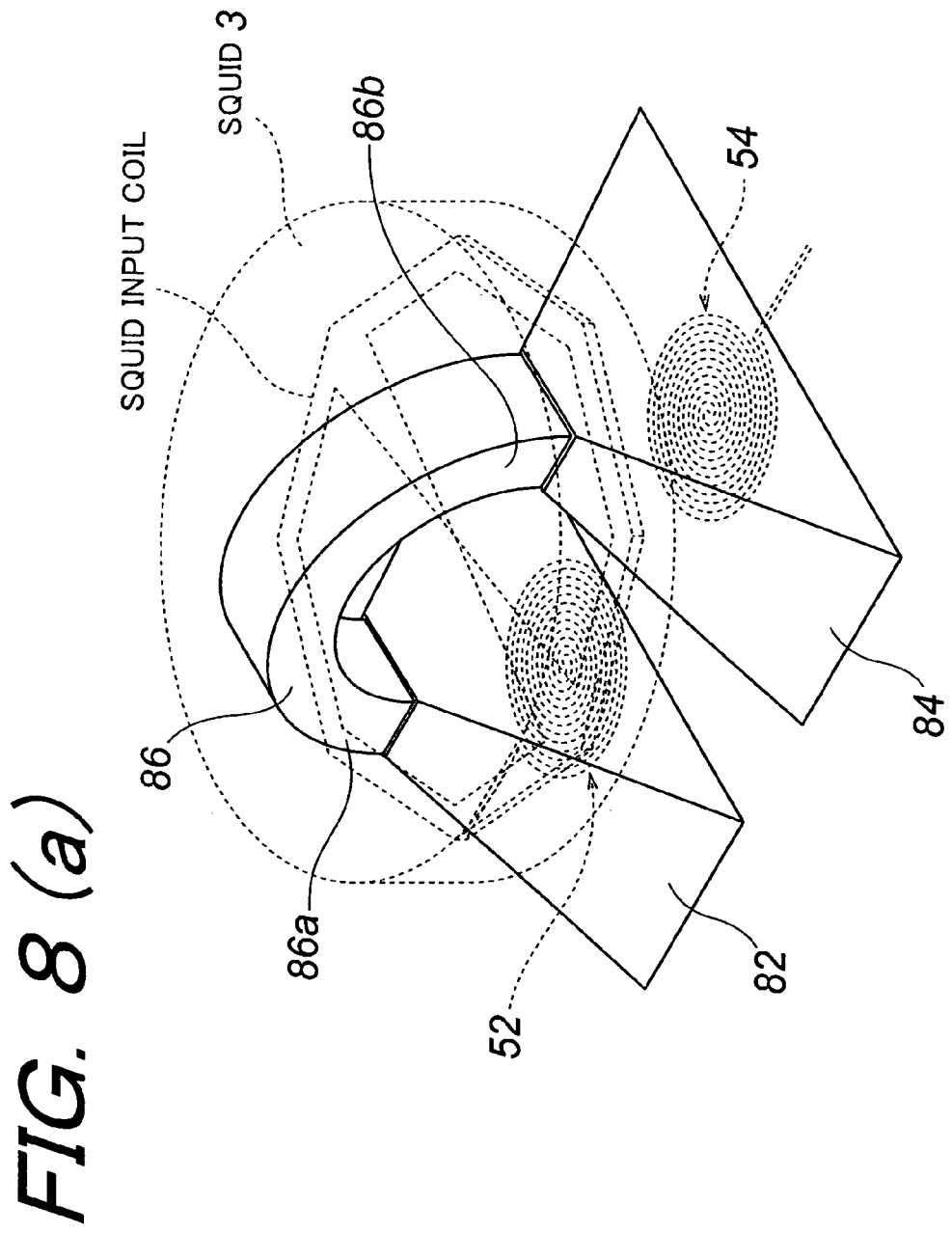
FIG. 8(a) shows an exemplary view of the schematic constitution of the bridge unit of the beam current sensor according to another example of the embodiments of the present invention, this embodiment shows an example of a constitution where a magnetic body such as a high-permeability toroidal core is introduced in the embodiment shown in FIG. 5(a)(b), which is a perspective exemplary view of the schematic constitution of a principal portion.
FIG. 8(b) shows an exemplary view of the schematic constitution of the bridge unit of the beam current sensor according to another example of the embodiments of the present invention, this embodiment shows an example of the constitution where the magnetic body such as the high-permeability toroidal core is introduced in the embodiment shown in FIG. 5(a)(b), which is a partially sectioned conceptual exemplary view of the schematic constitution corresponding to FIG. 5(b).
Figure 8:
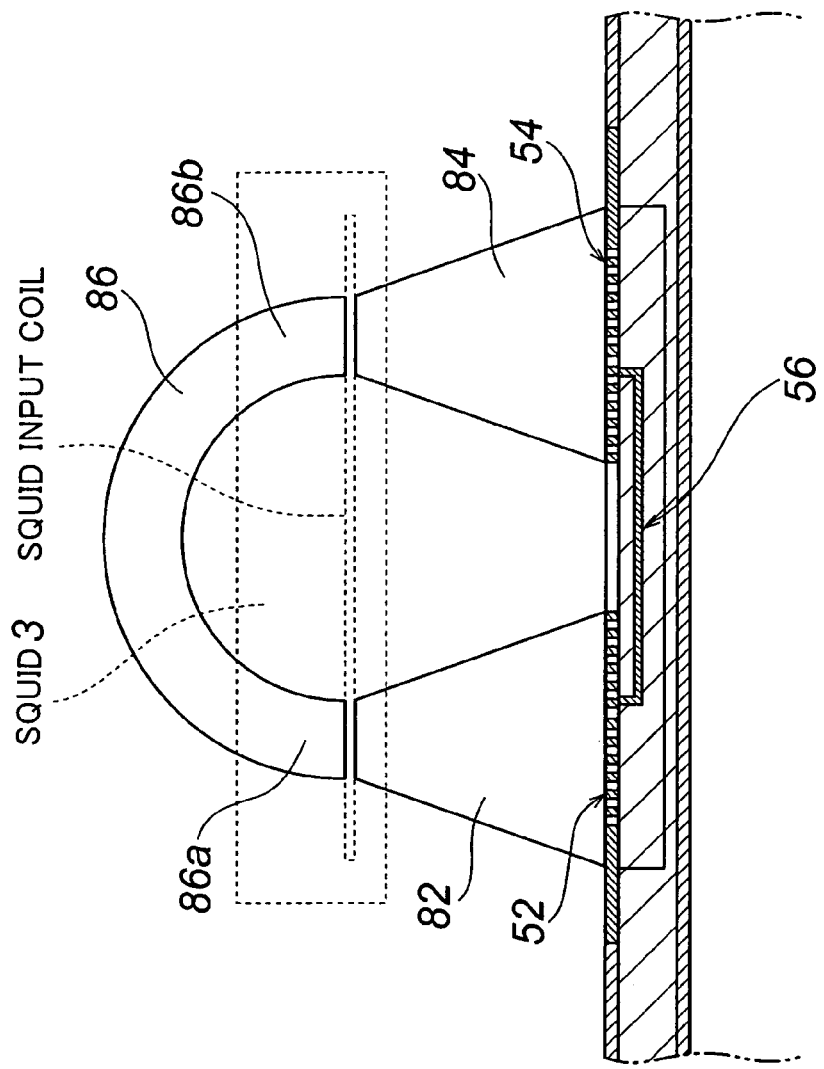
Figure 9:
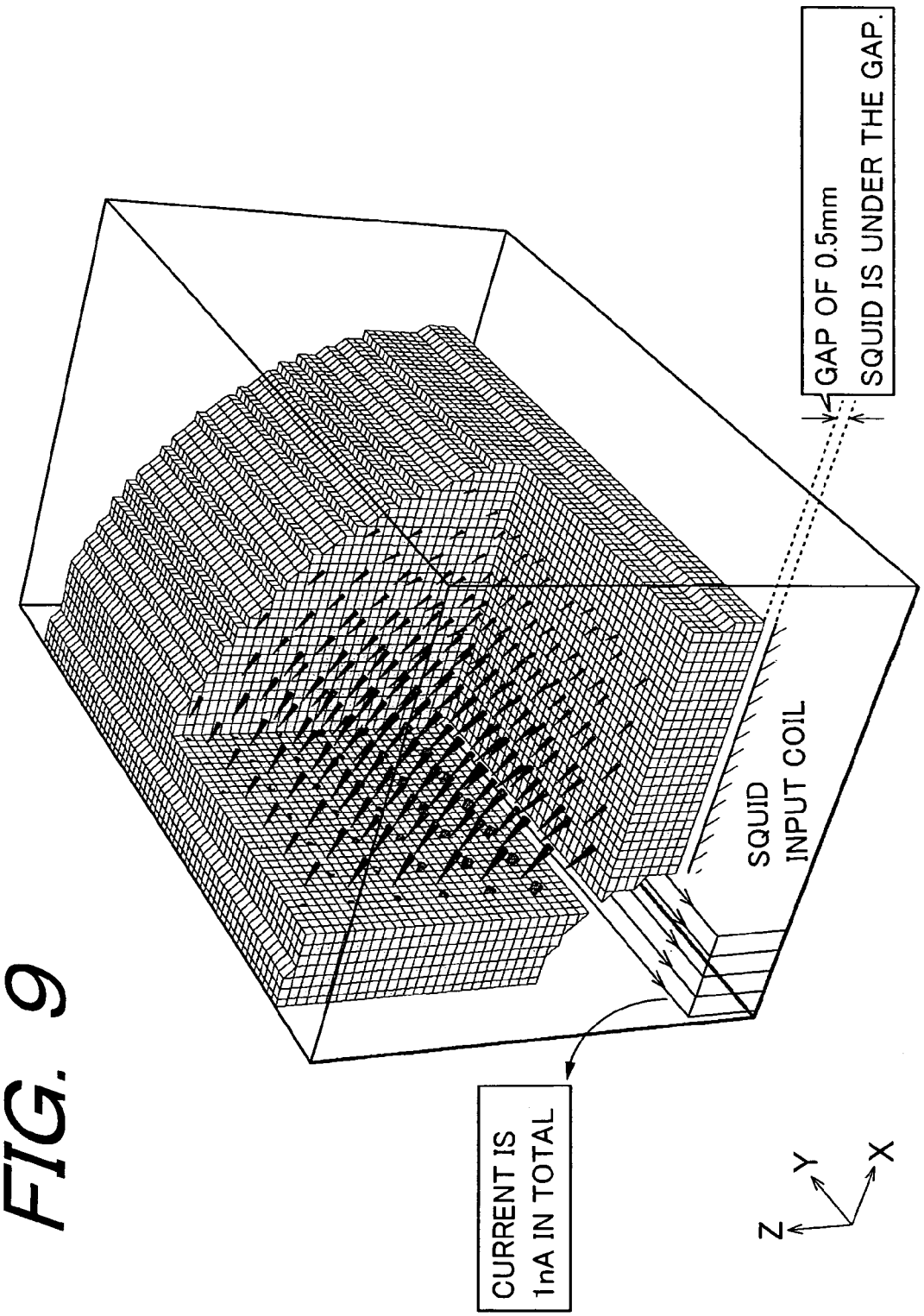
FIG. 9 shows a calculation result using a finite element method program (MAFIA) regarding the embodiment shown in FIG. 8, which shows an appearance of a magnetic flux at the other end portion of the third soft magnetic body arranged above the SQUID input coils with the gap of 0.5 mm.
Figure 10:
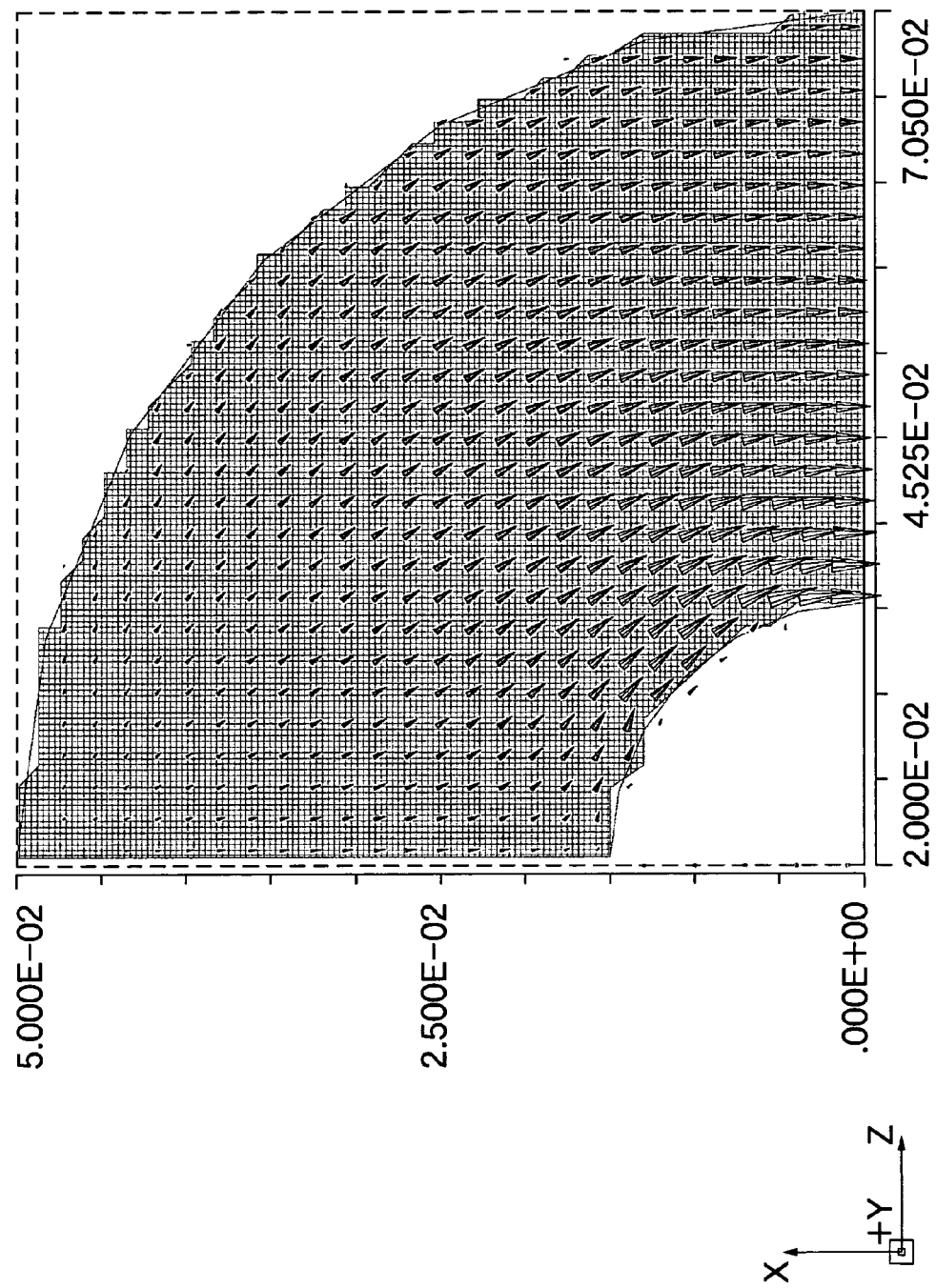
FIG. 10 shows a calculation result using the finite element method program (MAFIA) regarding the embodiment shown in FIG. 8, which shows a sectional view of FIG. 9.
Figure 11:
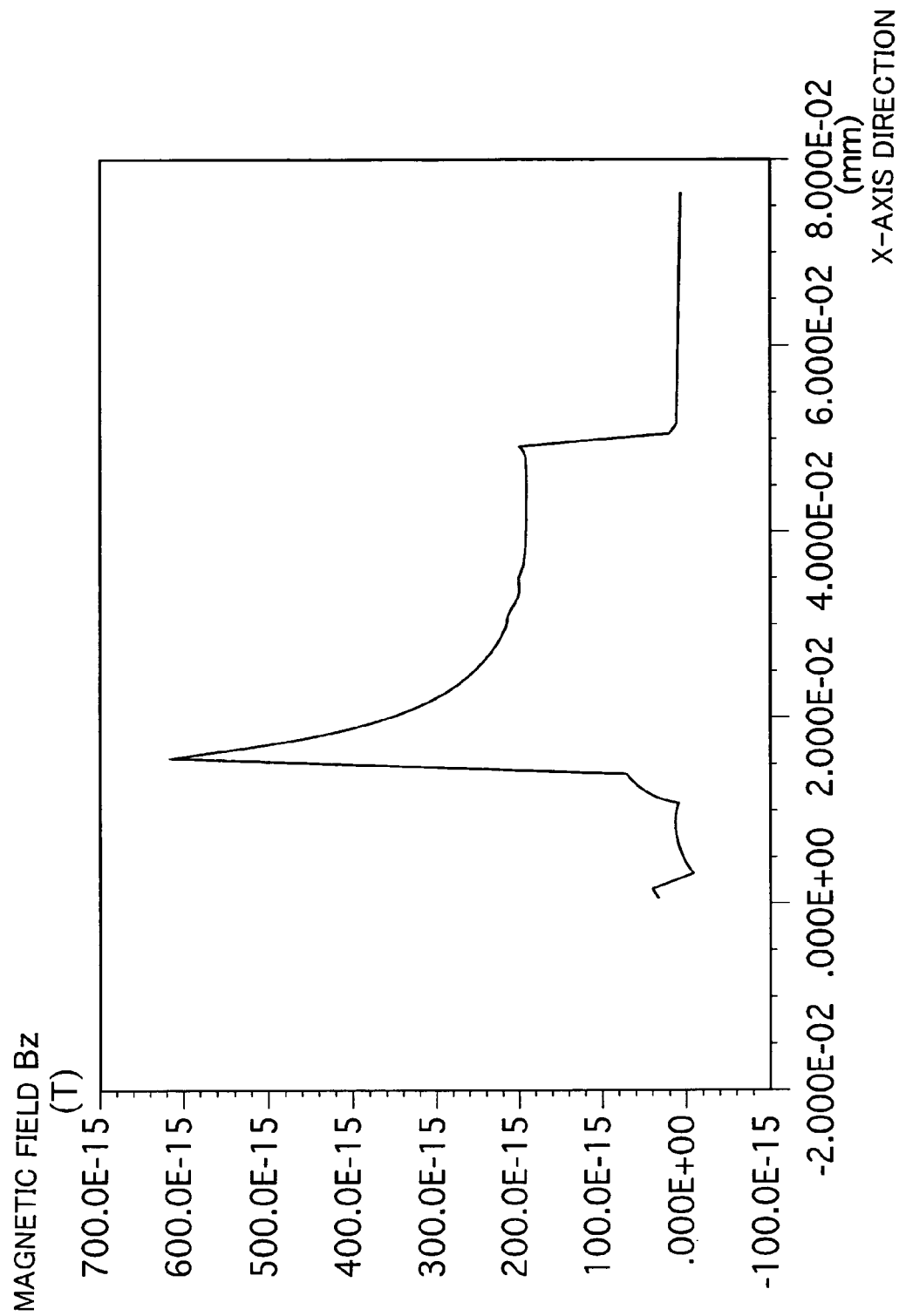
FIG. 11 shows a calculation result using the finite element method program (MAFIA) regarding the embodiment shown in FIG. 8, which shows a magnetic field of SQUID in Z-axis.

FIGS. 9 to 11 show the calculation results using the finite element method program (MAFIA) regarding the embodiment shown in FIG. 8.

Meanwhile, the condition of calculation is that mesh number (number of elements) is $2 \times 10^6$ and they are uniformly cut. Then, explanation is made regarding FIG. 9 that a boundary condition is applied where the magnetic field is directed vertically only to ZY plane and the vertical component of magnetic field on all the other planes is 0. In other words, ZY plane having only the vertical component is intended that the above-described calculation is symmetrical on ZY plane and it means that calculation half the entire one is enough.

Further, the relative permeability of the first soft magnetic body 82, the second soft magnetic body 84 and the third soft magnetic body 86 is $5 \times 10^5$, MAFIA sets accuracy, and repeats iteration until a value falls within a set value. The accuracy is a residual between the previous calculation and the current calculation, where it was set to $10^{-6}$ in the current calculation and converged in several thousand times of iteration. It is to be noted that the current value is 1 nA in total as shown in FIG. 9.

Herein, FIG. 9 shows the appearance of the magnetic flux at the end portion 86b of the third soft magnetic body 86 arranged above the SQUID input coil with the gap of 0.5 mm.

Further, FIG. 10 shows the sectional view of FIG. 9, and FIG. 11 shows the magnetic field of the SQUID 3 in Z-axis.

These calculation results show that the sensitivity of SQUID is improved about 300 times and the faint beam current value of about 1 nA can be measured.

Next, description will be made for the beam current sensor of another example of the embodiments of the present invention with reference to FIG. 12 to FIG. 20.

In the beam current sensor according to the embodiment shown in FIG. 12 to FIG. 23, its bridge unit is constituted of a super-conductive material that is a high-temperature super-conductive material, for example, as a solid bridge unit 150 of a three-dimensional shape that is formed in a horseshoe shape in a standing manner so as to pass over the insulator (substrate).

Figure 12:
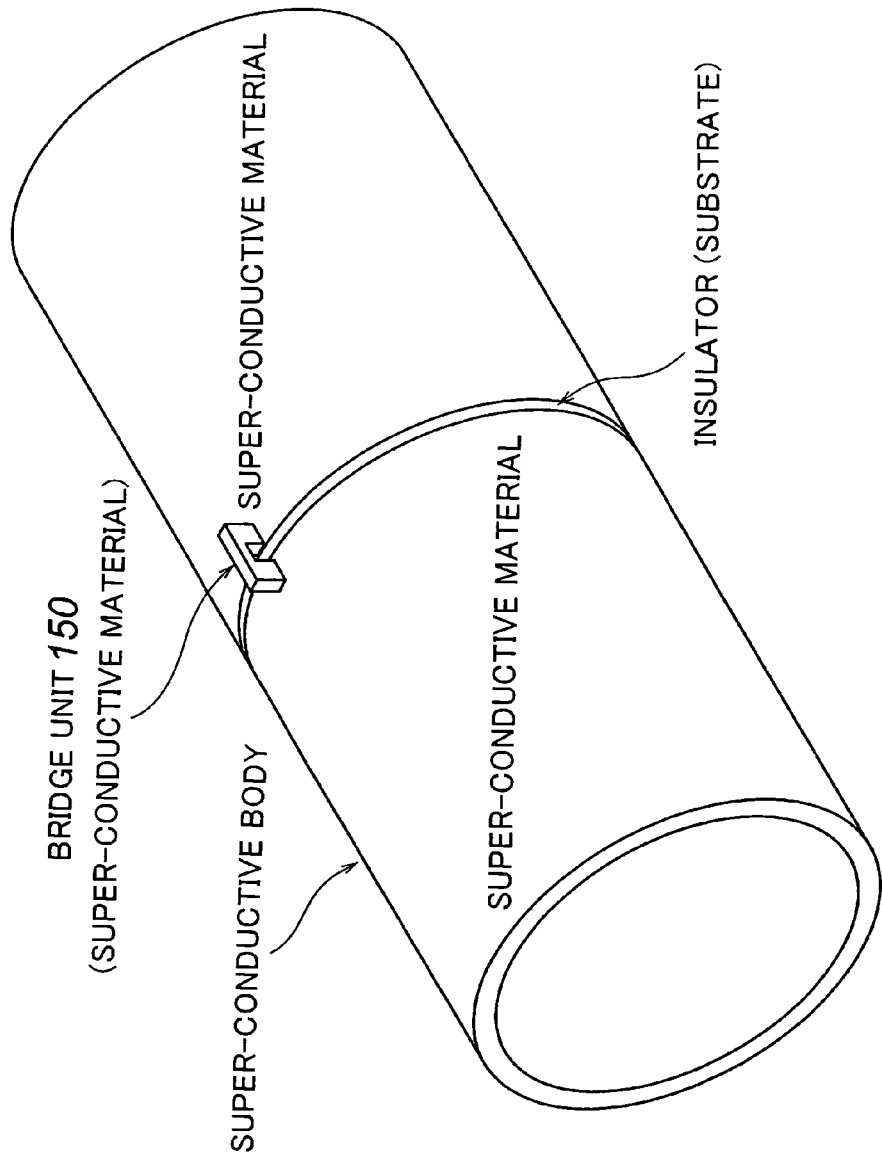
FIG. 12 is a perspective view showing a constitution of the bridge unit of the beam current sensor according to another example of the embodiments of the present invention.
Figure 13:
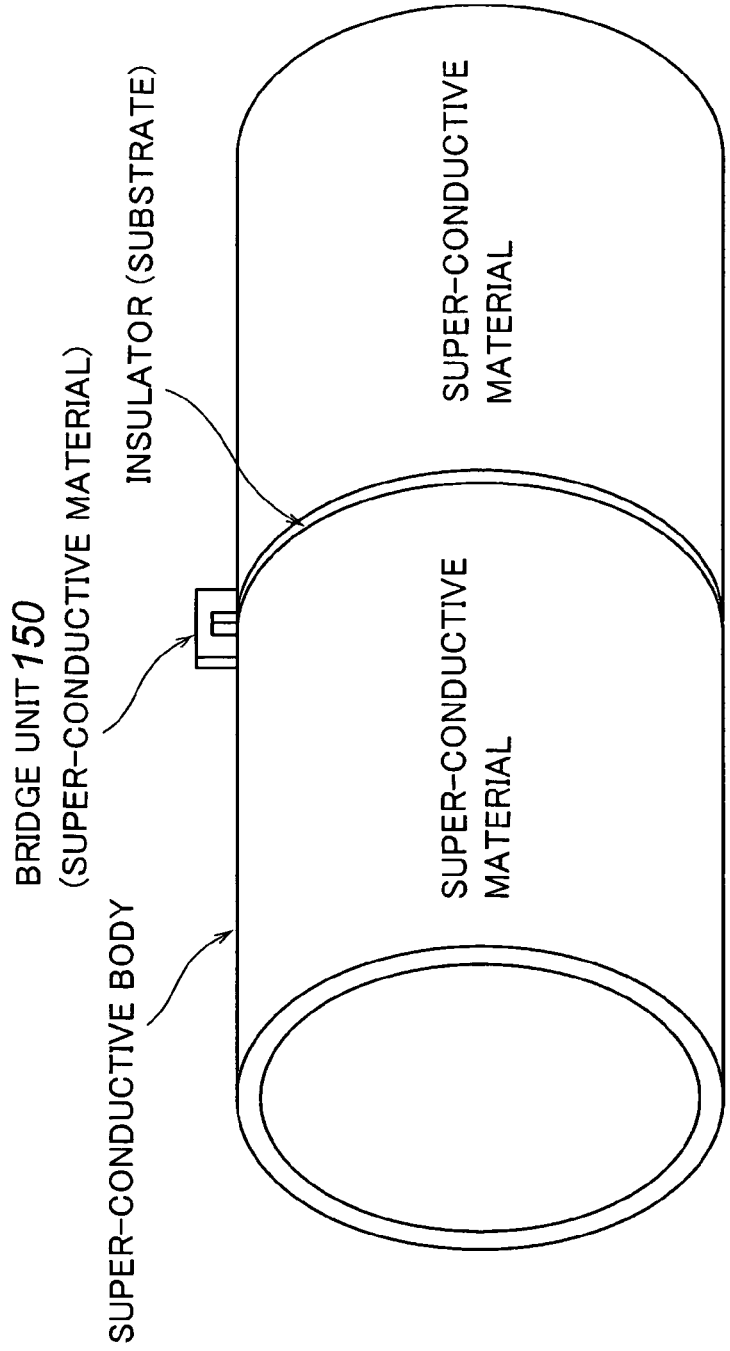
FIG. 13 is a perspective view showing a constitution of the bridge unit of the beam current sensor according to another example of the embodiments of the present invention, which is the perspective view from a direction different from FIG. 12.

In other words, the bridge unit 150 is arranged so as to electrically connect the super-conductive materials that are electrically insulated by the insulator (substrate) with the horseshoe shaped both end portions, as shown in FIG. 12 to FIG. 14. A gap 150a is formed between the bridge unit 150 formed in a standing manner and the insulator (substrate).

Figure 15:
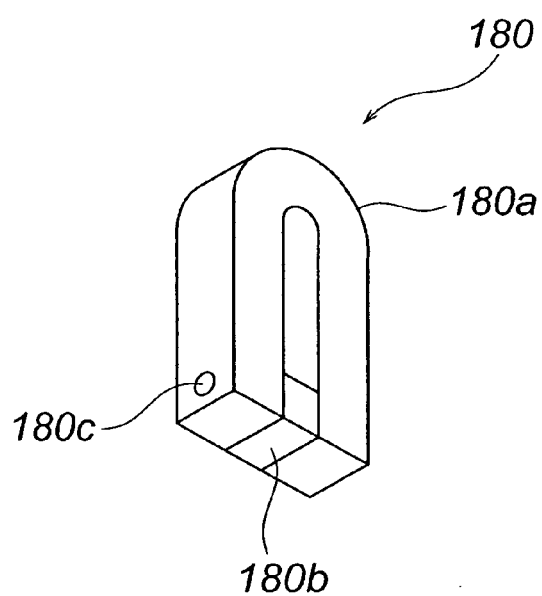
FIG. 15 is a perspective view of a high-permeability toroidal core of an approximately square frame shape, which is used as a soft magnetic body in combination with the bridge unit of the beam current sensor according to another example of the embodiments of the present invention shown in FIG. 12 and FIG. 13.

Further, FIG. 15 shows a high-permeability toroidal core 180 of an approximately square frame shape, which is used as a soft magnetic body in combination with the bridge unit 150. The high-permeability toroidal core 180 forms a magnetic closed loop.

The high-permeability toroidal core 180 is constituted of a first soft magnetic body 180a of an approximately U-shape where end portions of both leg portions are remote and open; a second soft magnetic body 180b of a rectangular parallelepiped whose dimensions are set such that the body can be fitted into the open positions, where the both leg portions of the first soft magnetic body 180a of an approximately U-shape are remote, without a gap; and a third soft magnetic body 180c that is inserted into through holes (180a-a, 180a-2), which are severally formed in the end portions of the both leg portions of the first soft magnetic body 180a, and a through hole 180b-1 formed in the approximately center of the second soft magnetic body 180b, and connects the first soft magnetic body 180a with the second soft magnetic body 180b without magnetic shutdown. It is to be noted that the dimensions of the first soft magnetic body 180a, the second soft magnetic body 180b and the third soft magnetic body 180c are set in such a manner that the second soft magnetic body 180b can be arranged in the gap 150a while the extending direction of the through hole 180b-1 is matched with the extending direction of the insulator (substrate) (refer to (1)(2) of FIG. 19), and the dimensions of the first soft magnetic body 180a and the third soft magnetic body 180c are set in such a manner that the first soft magnetic body 180a is arranged so as to pass over the bridge unit 150 and be connectible with the second soft magnetic body 180b (refer to (3)(4)(5) of FIG. 19).

The beam current sensor according to the embodiment shown in FIG. 12 to FIG. 20 uses the bridge unit 150 having the above-described constitution and the high-permeability toroidal core 180, and the SQUID 3 is arranged adjacently to the bridge unit 150 and the high-permeability toroidal core 180.

Figure 16:
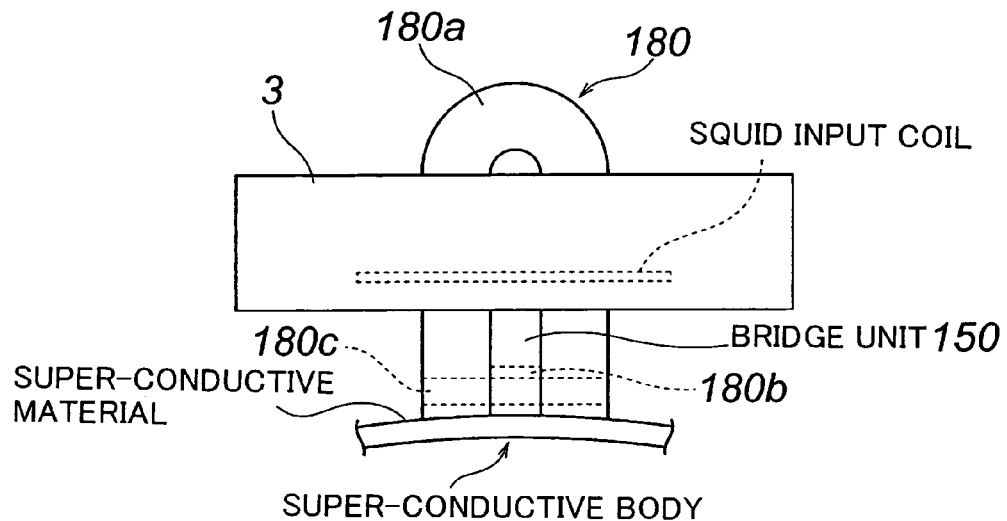
Figure 16:
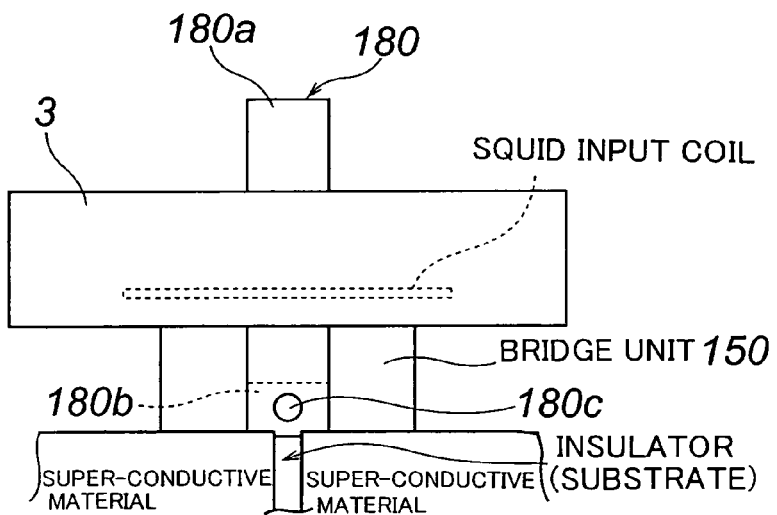

In other words, as shown in FIG. 16, the SQUID 3 is arranged so as to insert the both leg portions of the first soft magnetic body 180a into the space areas of the SQUID input coil, and the SQUID input coil is arranged between the bridge unit 150 and the high-permeability toroidal core 180.

Figure 17A:
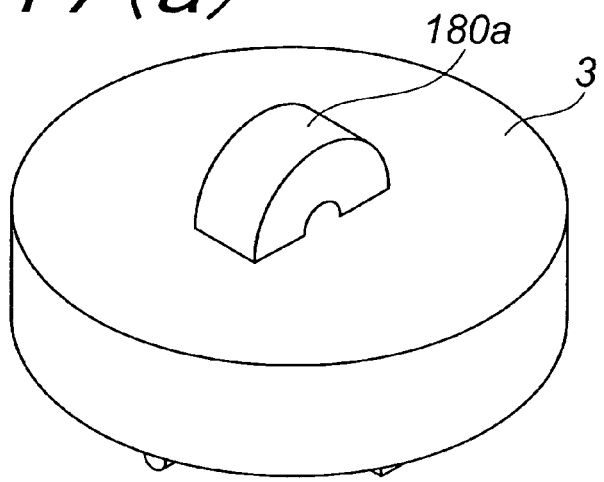
FIG. 17(a) is an upper perspective view showing the state where the SQUID is arranged on the high-permeability toroidal core.
Figure 17B:
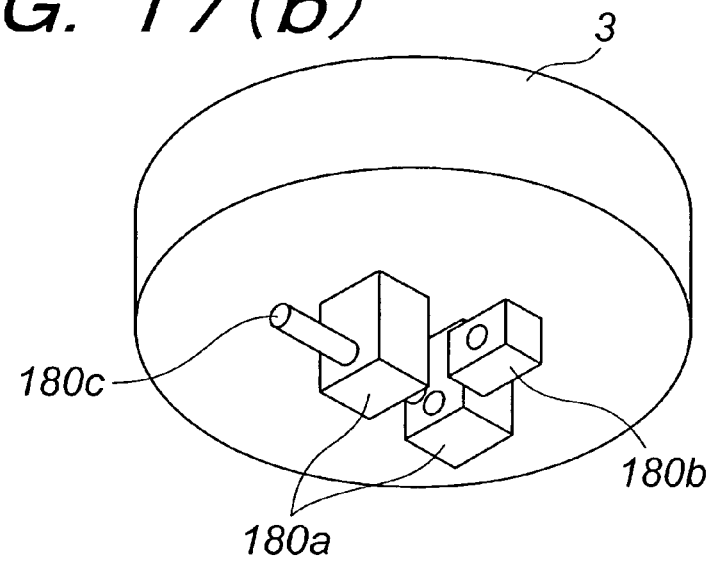
FIG. 17(b) is an upper perspective view showing the state where the SQUID is arranged on the high-permeability toroidal core.
Figure 18:
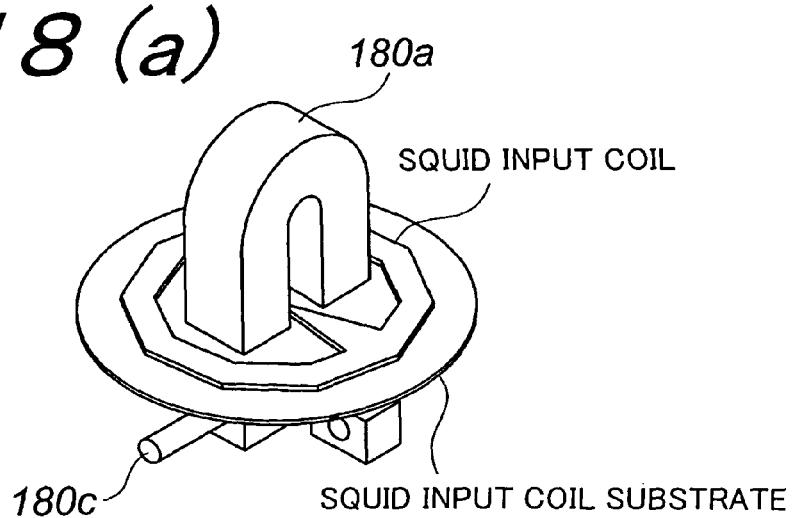
FIG. 18(a) is an upper perspective view of the state where a mold, which surrounds a SQUID input coil substrate on which a SQUID input coil is disposed, is removed, which corresponds FIG. 17(a)
FIG. 18(b) is a lower perspective view of the state where the mold, which surrounds the SQUID input coil substrate on which the SQUID input coil is disposed, is removed, which corresponds FIG. 17(b).
Figure 18:
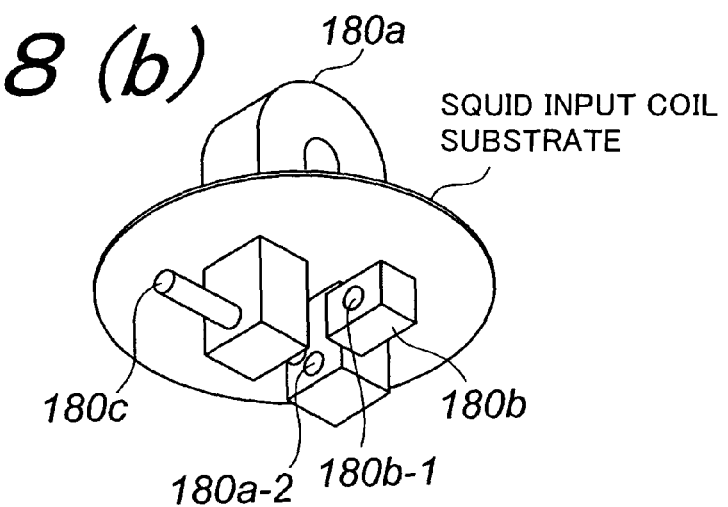
Figure 19:
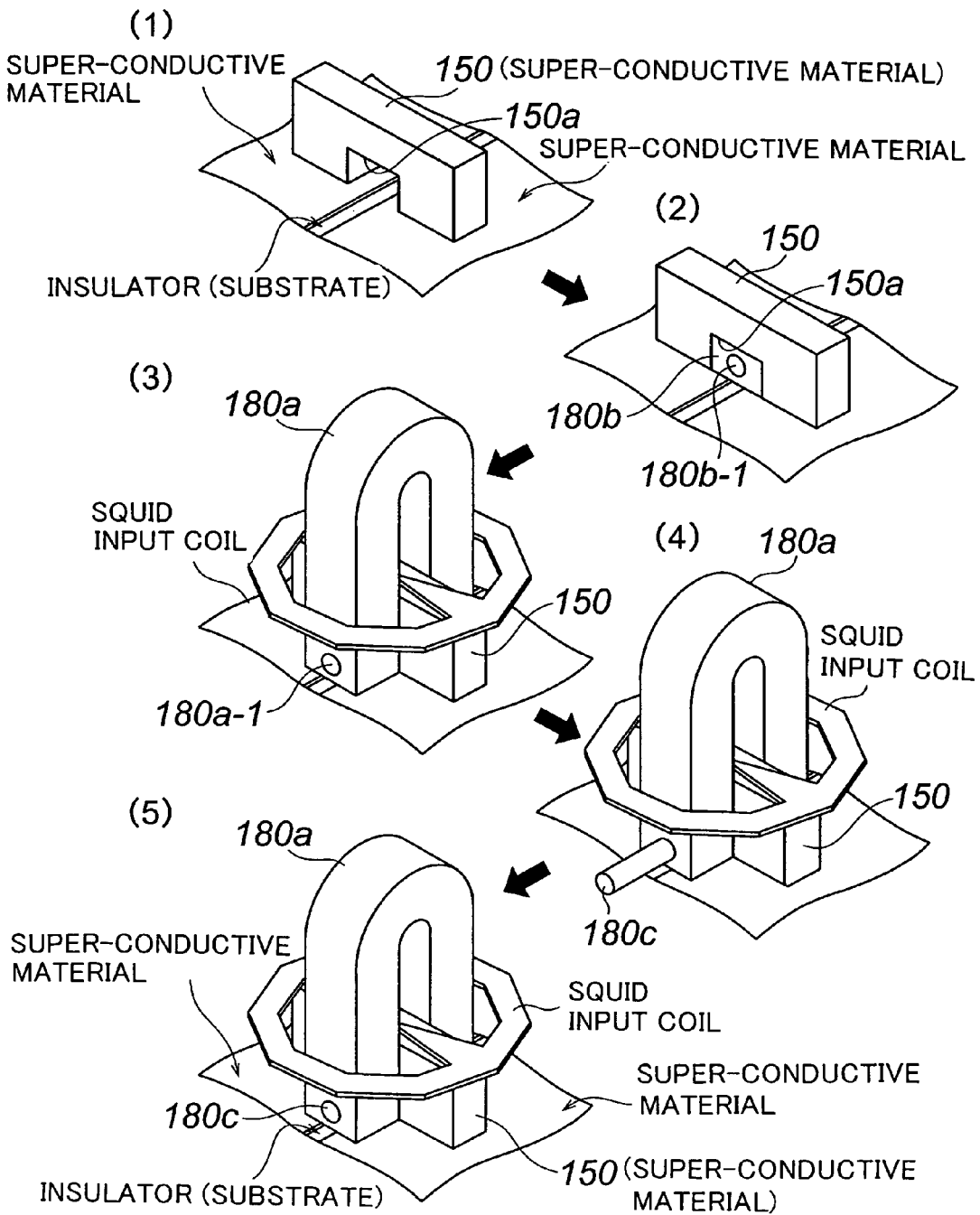
FIGS. 19(1) to (5) are exemplary views showing a procedure where the high-permeability toroidal core and the SQUID are attached to the bridge unit.

Herein, FIG. 17(a) shows the upper perspective view showing the state where the SQUID 3 is arranged on the high-permeability toroidal core 180, FIG. 17(b) shows the lower perspective view showing the state where the SQUID 3 is arranged on the high-permeability toroidal core 180, FIG. 18(a) shows the upper perspective view of the state where the mold, which surrounds the SQUID input coil substrate on which the SQUID input coil is disposed, is removed, which corresponds FIG. 17(a), FIG. 18(b) shows the lower perspective view of the state where the mold, which surrounds the SQUID input coil substrate on which the SQUID input coil is disposed, is removed, which corresponds FIG. 17(b), and description will be made for the attaching method of the high-permeability toroidal core 180 and the SQUID 3 to the bridge unit 150 by referring to FIG. 19. It is to be noted that only the SQUID input coil is shown as the SQUID 3 in FIG. 19 for easier understanding.

To attach the high-permeability toroidal core 180 and the SQUID 3 to the bridge unit 150, the second soft magnetic body 180b is arranged in the gap 150a of the bridge unit 150 first while the extending direction of the through hole 180b-1 is matched with the extending direction of the insulator (substrate) (refer to FIG. 19(1)(2)).

Next, the first soft magnetic body 180a is arranged on the bridge unit 150 so as to pass over the bridge unit 150 in such a manner that the both leg portions of the first soft magnetic body 180a are inserted into the space areas of the SQUID input coil (refer to FIG. 19(3)).

Further, the third soft magnetic body 180c is inserted into the through holes (180a-1, 180a-2, 180b-1) to attach the high-permeability toroidal core 180 and the SQUID 3 to the bridge unit 150 (refer to FIG. 19(4)(5)).

Figure 20A:
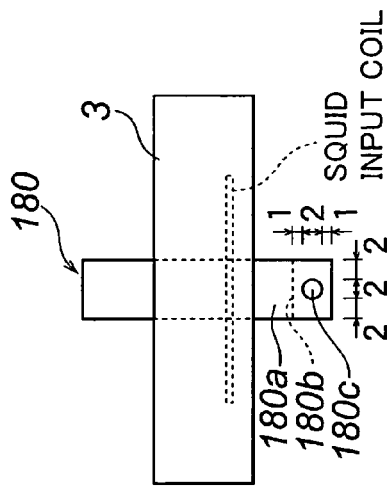
FIG. 20(a) is a front view.
Figure 20B:
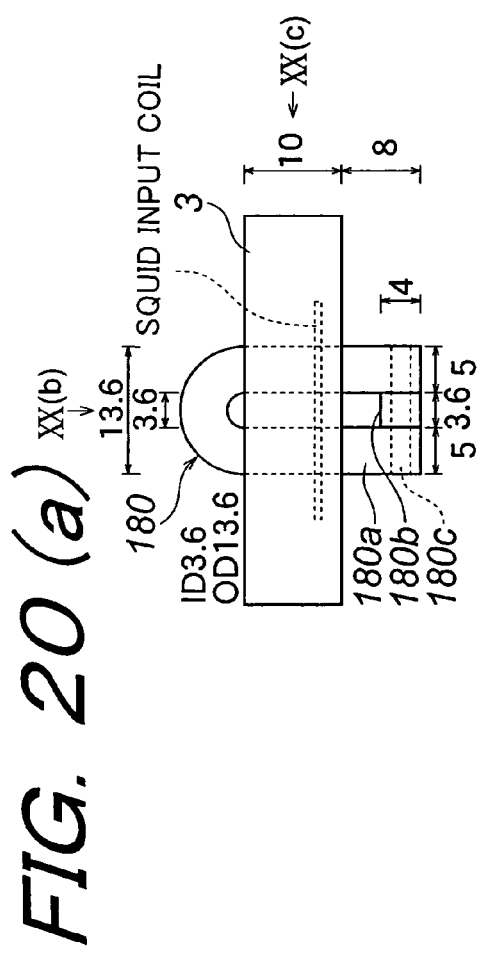
FIG. 20(b) is a view seen from arrow XX(b)
Figure 20C:
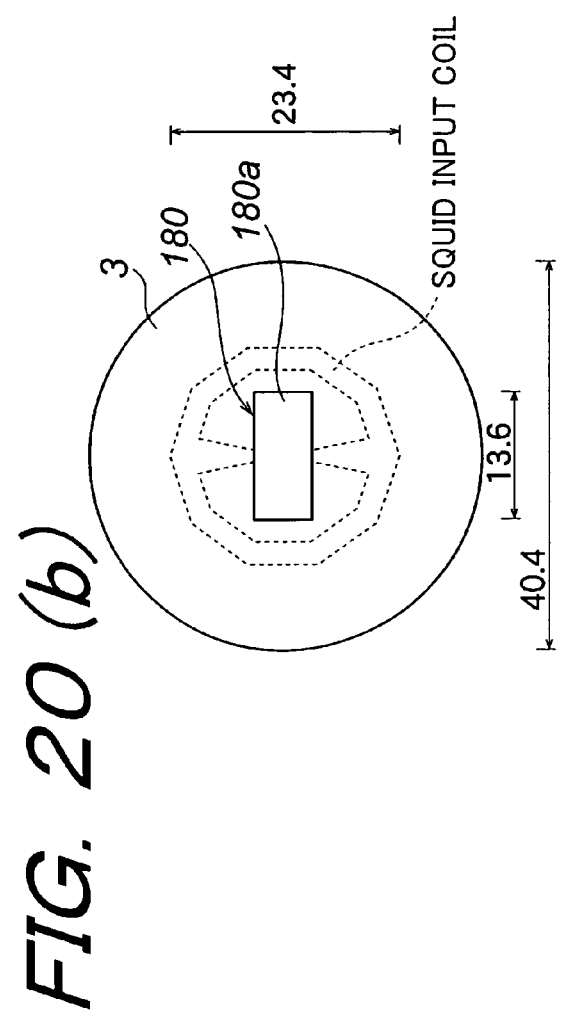
FIG. 20(c) is a view seen from arrow XX(c).

It is to be noted that FIG. 20 shows the state where the SQUID 3 is attached to the high-permeability toroidal core 180, in which (a) is the front view, (b) is the view seen from arrow XX(b), and (c) is the view seen from arrow XX(c).

Figure 22:
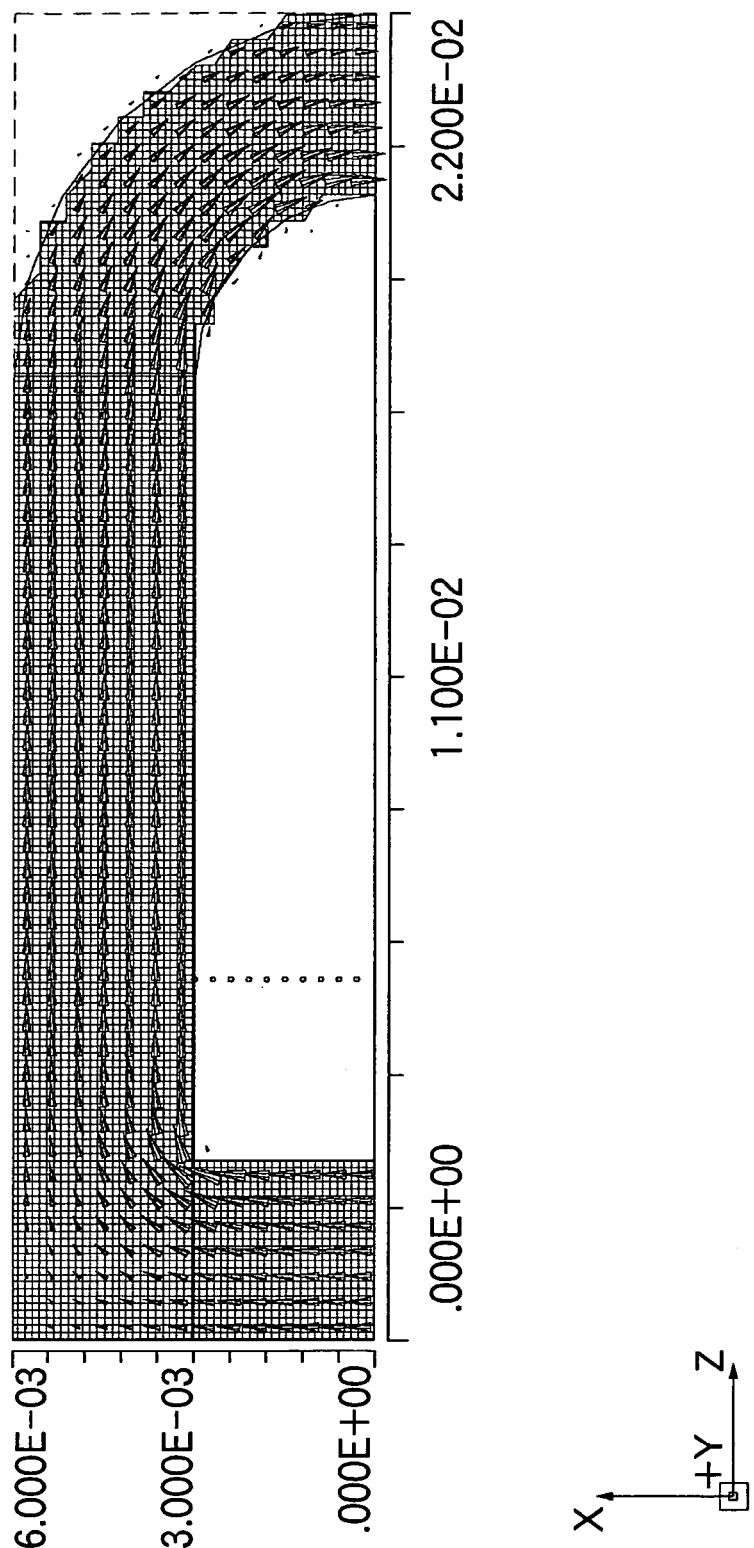
FIG. 22 shows a calculation result using the finite element method program (MAFIA) regarding the embodiment shown in FIG. 12 to FIG. 20, which shows a sectional view of FIG. 21.
Figure 23:
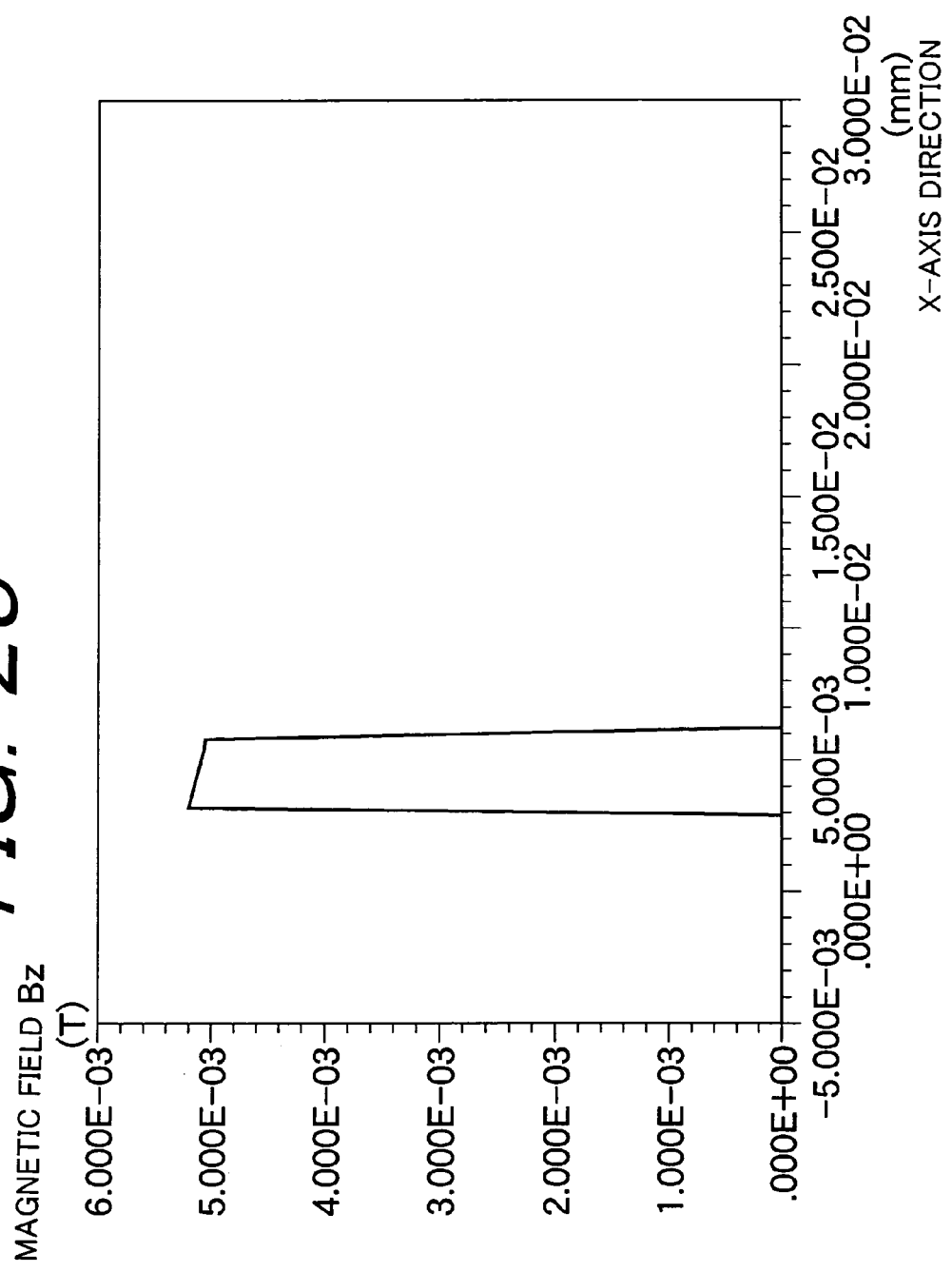
FIG. 23 shows a calculation result using the finite element method program (MAFIA) regarding the embodiment shown in FIG. 12 to FIG. 20, which shows a magnetic field of the SQUID in Z-axis.

FIG. 21 to FIG. 23 show the calculation results using the finite element method program (MAFIA) regarding the embodiment shown in FIG. 12 to FIG. 20.

Meanwhile, the condition of calculation is that mesh number (number of elements) is $2\times10^6$ and they are uniformly cut. Then, explanation is made regarding FIG. 21 that a boundary condition is applied where the magnetic field is directed vertically only to ZY plane and the vertical component of magnetic field on all the other planes is 0. In other words, ZY plane having only the vertical component is intended that the above-described calculation is symmetrical on ZY plane and means that calculation half the entire one is enough.

Further, the relative permeability of the high-permeability toroidal core 180 is $5\times10^5$, MAFIA sets accuracy, and repeats iteration until a value falls within a set value. The accuracy is a residual between the previous calculation and the current calculation, where it was set to $10^{-6}$ in the current calculation and converged in several thousand times of iteration. It is to be noted that the current value is 1 mA in total as shown in FIG. 21.

Herein, FIG. 21 shows the appearance of the magnetic flux of the high-permeability toroidal core 180. Further, FIG. 22 shows the sectional view of FIG. 21, and FIG. 23 shows the magnetic field of the SQUID 3 in Z-axis.

From these calculation results, the magnetic field of 5 nT is generated on the SQUID input coil when the current of 1 mA flows in the bridge unit 150. When it is converted linearly, it corresponds to the magnetic field of 5 nT at the current of 1 nA.

In other words, in the embodiment shown in FIG. 12 to FIG. 20, the sensitivity of the SQUID is remarkably improved because the high-permeability toroidal core 180 forms a loop that is magnetically closed (magnetic closed loop) and magnetic field does not have an escape, and it shows that the faint beam current value of 1 nA can be measured.

Meanwhile, the above-described embodiments may be appropriately modified as explained in (1) to (8) below.

(1) In the above-described embodiments, the bridge unit 50 is constituted by including the first coil unit 52 formed so as to have the spiral shape traveling counterclockwise from the outer diameter side toward the inner diameter side on the left area of the center C of the SQUID input coil on FIG. 5(a); the second coil unit 54 formed so as to have the spiral shape traveling clockwise from the outer diameter side toward the inner diameter side on the right area of the center C of the SQUID input coil on FIG. 5(a); and the connection portion 56 for connecting the center position 52a of the inner diameter side of the first coil unit 52 of the spiral shape with the center position 54a of the inner diameter side of the second coil unit 54 of the spiral shape, but it goes without saying that the invention is not limited to this. In other words, the turning direction and the number of turns, the sectional shape and the size, furthermore, the outer diameter or the like of coil in the first coil unit 52 and the second coil unit 54, may be appropriately changed according to a desired specification request. In addition, the bridge unit may be constituted of a single coil unit instead of the two coil units such as the first coil unit 52 and the second coil unit 54.

(2) In the above-described embodiments, the mask of coil pattern is attached to the substrate after coating and creating the high-temperature super-conductive material on it, but it goes without saying that the invention is not limited to this. In other words, the coil unit on the bridge unit may be manufactured by precisely processing coil grooves by laser on the substrate that has been formed of MgO or the like and by sintering it after coating the super-conductive material such as the high-temperature super-conductive material of Bi system on the grooves.

(3) It goes without saying that the shape of the high-permeability toroidal core 80, the first soft magnetic body 82, the second soft magnetic body 84 or the third soft magnetic body 86 is not limited to the above-described shapes, and arbitrary shapes such as a rectangular parallelepiped and a cube may be appropriately selected according to a desired specification request.

(4) In the embodiment shown in the above-described FIG. 12 to FIG. 20, the bridge unit 150 is constituted in a solid shape to form the gap 150a and the magnetic closed loop is formed by inserting a part of the high-permeability toroidal core 180 into the gap 150a, but it goes without saying that the invention is not limited to this. For example, the bridge unit in the super-conductive body is constituted in a conventional constitution or another embodiment, a through hole is formed near the bridge unit of the super-conductive body, the high-permeability toroidal core 180 is inserted into the through hole, and a closed loop surrounding the bridge unit may be constituted by the high-permeability toroidal core 180.

(5) In the embodiment shown in the above-described FIG. 12 to FIG. 20, the high-permeability toroidal core 180 and the SQUID 3 are constituted as separate bodies and they are assembled when attaching to the bridge unit 150, but it goes without saying that the invention is not limited to this. The high-permeability toroidal core 180 and the SQUID 3 may be integrally formed in advance.

(6) In the above-described embodiments, the material of Bi system is used as the high-temperature super-conductive material, but Bi2223, Bi2212 or the like can be used as the material of Bi system.

In short, it is possible to manufacture the beam current sensor and the magnetic shield by sintering 99.9% MgO after coating Bi2223 on it.

A characteristic of Bi2223 is that a large margin to liquid nitrogen temperature can be secured due to high transition temperature of 106K and therefore it is stable for temperature changes. However, since the optimum film thickness is as thick as about 300 μm, a process of sintering for 5 days and compressing by 20 atmospheres of water, for example, must be performed for three times. Further, in the case of requiring a complex shape, it is extremely difficult to prevent the substrate of MgO from breaking when it is compressed by water. Even if the substrate of MgO can be formed in a complex shape without being broken, it is necessary to control the high-temperature super-conductive body and the MgO substrate to prevent them from being peeled from each other because of different temperature coefficient.

On the other hand, although Bi2212 is the same high-temperature super-conductive body of Bi system, it is formed on 99.9% silver by a process called a melting method. Since the optimum film thickness of Bi2212 is about 70 μm which is thinner than Bi2223, it can be manufactured in a process of one week and the process of compressing by water pressure is not needed. Because the super-conductive body is formed at slightly lower temperature than the melting point of silver being the substrate, it is formed by melting literally. However, although the margin to liquid nitrogen temperature becomes small because critical temperature is as low as 83K, it is possible to maintain the temperature lower than 70K by using a freezer. Further, in the case of forming a complex shape, Bi2212 does not need the compression process by water pressure and bond between the high-temperature super-conductive body and the silver substrate is strong, so that the problem of peeling is harder to occur comparing to Bi2223.

Therefore, as the high-temperature super-conductive material, a desired material may be selected taking the above-described characteristic of each material into consideration.

Figure 24:
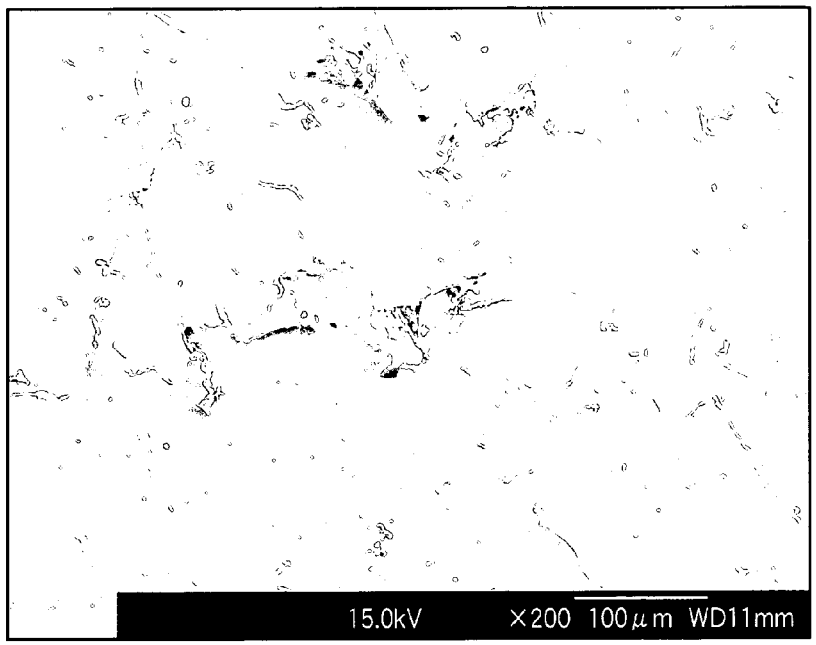
FIG. 24 is an exemplary view showing the state where surface of Bi2212 is observed by an electron microscope.
Figure 25:
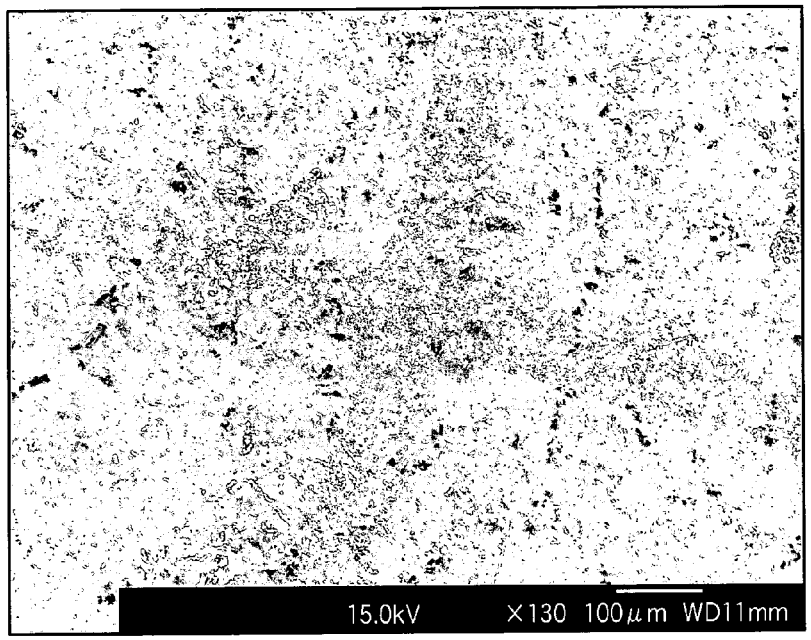
FIG. 25 is an exemplary view showing the state where surface of Bi2223 is observed by the electron microscope.

It is to be noted that FIG. 24 shows the exemplary view showing the state where the surface of Bi2212 is observed by the electron microscope, and FIG. 25 shows the exemplary view showing the state where the surface of Bi2223 is observed by the electron microscope. When FIG. 24 and FIG. 25 are compared, the surface of Bi2212 is smoother.

(7) In the embodiment shown in the above-described FIG. 12 to FIG. 20, the high-permeability toroidal core 180 is constituted by the first soft magnetic body 180a, the second soft magnetic body 180b and the third soft magnetic body 180c, but it goes without saying that the invention is not limited to this. In other words, since the high-permeability toroidal core 180 should constitute the magnetic closed loop, it may be constituted by connecting the first soft magnetic body 180a and the second soft magnetic body 180b by a connection member of an appropriate material.

(8) The above-described embodiments and the modification examples shown in (1) to (7) may be appropriately combined.

Furthermore, when the present invention is combined with a method of reducing an environmental magnetic field to about $1/10^6$ comparing to a conventional case having no shield, for example, it is possible to measure a faint beam current of nA order at even higher accuracy.

Meanwhile, as the method of reducing to about $1/10^6$ comparing with the conventional case having no shield, the method disclosed in Japanese Patent Application No. 2003-155407 filed on May 30, 2003 by Institute of Physical and Chemical Research (an independent administrative organization), which is the applicant of this application, or the like can be used.

INDUSTRIAL APPLICABILITY

The present invention can be used when a beam current meter, which measures a faint beam current of nA order non-destructively and highly accurately, is constituted, and the invention is preferably used particularly in combination with a SQUID.

The invention claimed is:

1. A beam current sensor comprising:
    a super-conductive body, which is a cylindrical body having an inner surface defining an interior and an outer surface, wherein a beam passes through the interior; and
    a bridge unit to which a SQUID input coil is adjacently arranged is formed on the outer surface;
    said bridge unit comprising:
    a first coil unit formed so as to have a spiral shape wound counterclockwise and having a first center;
    a second coil unit formed so as to have a spiral shape wound clockwise and having a second center; and
    a connection portion for connecting the first center position of said first coil unit with the second center position of said second coil unit,
    said beam current sensor comprising:
    a first soft magnetic body of an approximately rectangular parallelepiped shape arranged on said first coil unit;
    a second soft magnetic body of an approximately rectangular parallelepiped shape arranged on said second coil unit; and
    a third soft magnetic body including an approximately U-shape, where one end portion is arranged on said first soft magnetic body side and the other end portion is arranged on said second soft magnetic body side, and which bridges said first soft magnetic body and said second soft magnetic body,
    wherein said SQUID input coil is arranged between said first soft magnetic body and said one end portion of said third soft magnetic body and between said second soft magnetic body and said other end portion of said third soft magnetic body.

* * * * *